(12) United States Patent
Tsai et al.

(10) Patent No.: US 12,033,963 B2
(45) Date of Patent: Jul. 9, 2024

(54) PACKAGE STRUCTURE COMPRISING THERMALLY CONDUCTIVE LAYER AROUND THE IC DIE

(71) Applicant: Taiwan Semiconductor Manufacturing Company, Ltd., Hsinchu (TW)

(72) Inventors: Chung-Hao Tsai, Changhua County (TW); Tzu-Chun Tang, Kaohsiung (TW); Chuei-Tang Wang, Taichung (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/461,957

(22) Filed: Aug. 30, 2021

(65) Prior Publication Data
US 2023/0061876 A1 Mar. 2, 2023

(51) Int. Cl.
*H01L 23/66* (2006.01)
*H01L 23/00* (2006.01)
*H01L 23/29* (2006.01)

(52) U.S. Cl.
CPC ............ *H01L 23/66* (2013.01); *H01L 23/291* (2013.01); *H01L 24/19* (2013.01); *H01L 24/25* (2013.01); *H01L 24/29* (2013.01); *H01L 2223/6677* (2013.01); *H01L 2224/19* (2013.01); *H01L 2224/25171* (2013.01); *H01L 2224/255* (2013.01); *H01L 2224/29024* (2013.01); *H01L 2224/32146* (2013.01)

(58) Field of Classification Search
CPC ....... H01L 23/66; H01L 23/291; H01L 24/19; H01L 24/25; H01L 24/29
USPC .......................................................... 257/728
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2020/0312783 A1* | 10/2020 | Min | H01L 23/49822 |
| 2021/0020559 A1* | 1/2021 | Hung | H01Q 1/526 |
| 2021/0134724 A1* | 5/2021 | Rubin | H01L 23/5385 |

\* cited by examiner

*Primary Examiner* — Didarul A Mazumder
(74) *Attorney, Agent, or Firm* — JCIPRNET

(57) ABSTRACT

A package structure and a manufacturing method thereof are provided. The package structure includes a carrier substrate, an integrated circuit (IC) die thermally coupled to the carrier substrate through a thermally conductive layer, an antenna pattern disposed over the carrier substrate and the IC die, a redistribution structure disposed between the antenna pattern and the IC die, and an underfill disposed below and thermally coupled to the carrier substrate. The antenna pattern is electrically coupled to the IC die.

20 Claims, 20 Drawing Sheets

PACKAGE STRUCTURE COMPRISING THERMALLY CONDUCTIVE LAYER AROUND THE IC DIE

BACKGROUND

Integrated circuits are used in a variety of electronic applications, such as personal computers, cell phones, digital cameras, and other electronic devices. Due to the continuing scaling of device features and the demand of modern communication for more bandwidth, high performance package designs with integrated antenna are desired. However, such package structures consume more and more power and generate more heat. This heat must be dissipated to maintain acceptable operating temperatures and avoid reliability issues in the package structures. In view of this, various schemes have been proposed to provide heat dissipation to package structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
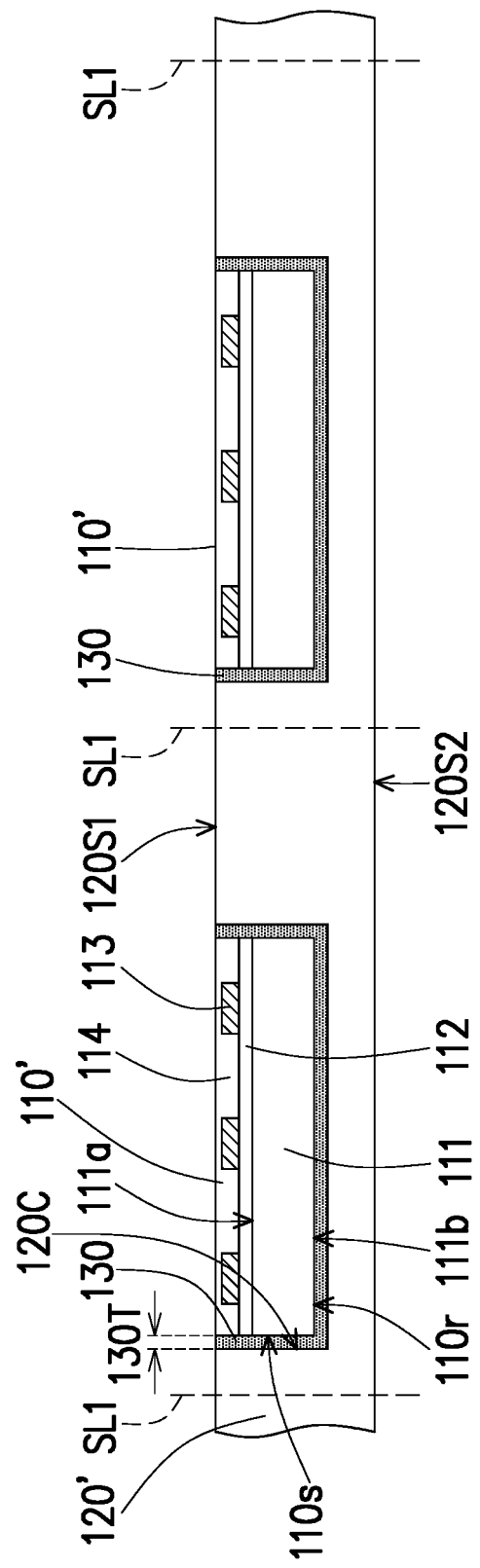
FIGS. 1A-1B are schematic cross-sectional views of various stages of manufacturing a die structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
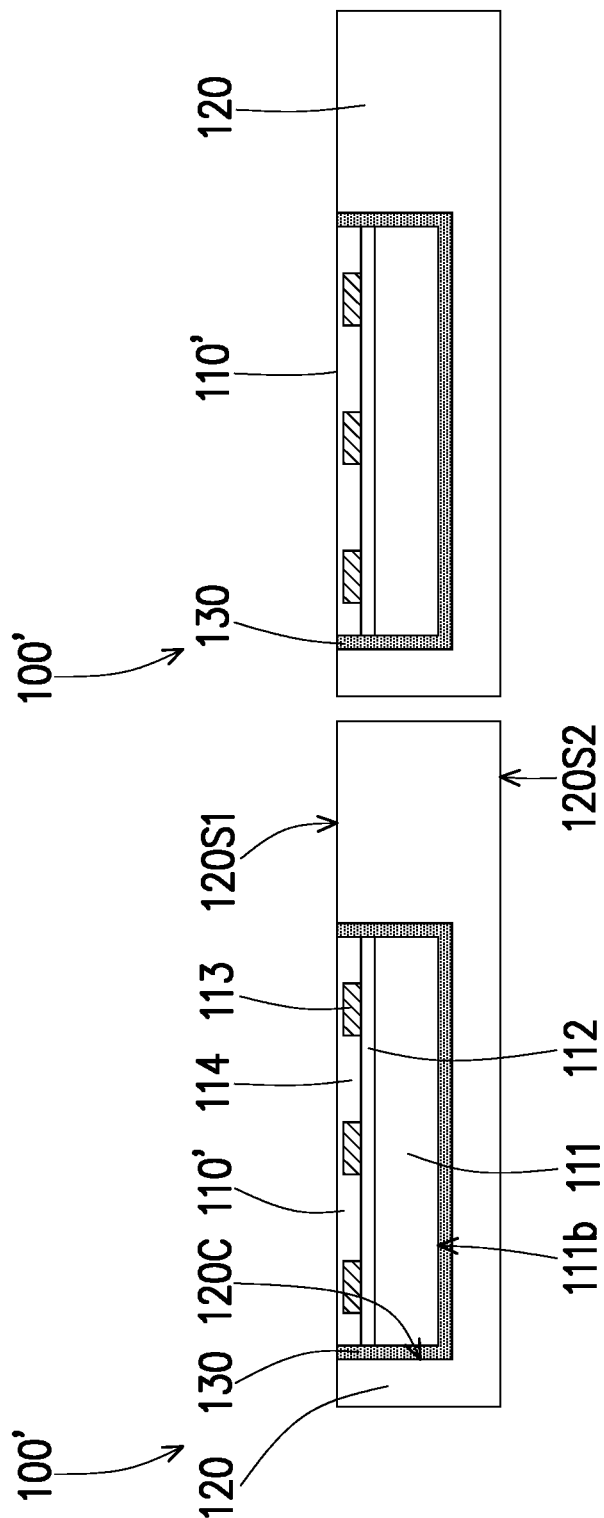

FIGS. 1A-1B are schematic cross-sectional views of various stages of manufacturing a die structure in accordance with some embodiments. Referring to FIG. 1A, at least one integrated circuit (IC) die 110' embedded in a carrier substrate 120' is provided. In some embodiments, the IC die 110' is initially formed in a semiconductor wafer (not shown), which may include different device regions that are singulated in subsequent steps to form a plurality of IC dies 110'. For example, the IC die 110' may be (or may include) a radio frequency (RF) IC die. Alternatively, the IC die 110' may be (or may include) a logic die, a memory die, an application-specific integrated circuit die, a power management die, a sensor die, a micro-electro mechanical system die, a signal processing die, the like, or other suitable types of IC die.

In some embodiments, the IC die 110' includes a semiconductor substrate 111, an interconnect structure 112 formed over the semiconductor substrate 111, a plurality of die connectors 113 formed over the interconnect structure 112, and a protection layer 114 covering the die connectors 113. The semiconductor substrate 112 may include semiconductor material(s), such as silicon; germanium; a compound semiconductor (e.g., SiC, InP, InAs, GaAs, GaP, etc.); an alloy semiconductor (e.g., SiGe, GaAsP, GaInAsP, GaInAs, GaInP, AlInAs, AlGaAs, etc.), and/or combinations thereof. Other substrates (e.g., semiconductor-on-insulator (SOI) substrates, multi-layered substrates, or gradient substrates) may be used. In some embodiments, the semiconductor substrate 112 has a first side (sometimes called an active side) 111a and a second side (sometimes called an inactive side) 111b opposite to each other, where semiconductor devices (not shown; e.g., transistors, diodes, capacitors, resistors, or the like) are formed at the first side 111a of the semiconductor substrate 111.

The interconnect structure 112 formed over the semiconductor substrate 111 may interconnect the semiconductor devices to form an integrated circuit. In some embodiments, the interconnect structure 112 is formed of alternating layers of dielectric (e.g., low-k dielectric material or the like) and conductive patterns (e.g., conductive lines, vias, pads, etc.), and may be formed by any suitable process (e.g., deposition, damascene, etc.). The die connectors 113 may be formed over the interconnect structure 112 and electrically coupled to the semiconductor devices through the interconnect structure 112. The die connectors 113 may be (or may include) conductive pillars, pads, or the like, to which external connections are made. The die connectors 113 may be formed by plating or the like.

The protection layer 114 may (or may not) be formed over the active side of the semiconductor substrate 111 to bury the die connectors 113 for protection, such that the topmost surface of the protection layer 114 is above the topmost surfaces of the die connectors 113. The protection layer 114 may be or may include a polymer (e.g., polybenzoxazole (PBO), polyimide (PI), benzocyclobutene (BCB), or the like); a nitride; an oxide, or a combination thereof, and may be formed by spin-coating, lamination, or any suitable deposition process. In some embodiments, the protection layer 114 has a sidewall substantially aligned with sidewalls of the interconnect structure 112 and the semiconductor substrate 111. For example, the sidewalls of the protection layer 114, the interconnect structure 112, and the semiconductor substrate 111 may be collectively viewed as the sidewall 110s of the IC die 110', and the second side 111b of the semiconductor substrate 111 may be viewed as the rear surface of the IC die 110'.

With continued reference to FIG. 1A, the carrier substrate 120' may be a semiconductor substrate formed of a material that has a good thermal conductivity to improve the heat dissipation efficiency of the resulting die structure. For example, the thermal conductivity of the carrier substrate 120' is in a range of over about 130 W/m–k. It should be understood that the thermal conductivity of the carrier substrate may vary depending on product requirements and is not restricted in the disclosure. In some embodiments, the carrier substrate 120' includes semiconductor material(s), such as silicon; germanium; a compound semiconductor (e.g., SiC, InP, InAs, GaAs, GaP, etc.); an alloy semiconductor (e.g., SiGe, GaAsP, GaInAsP, GaInAs, GaInP, AlInAs, AlGaAs, etc.), and/or combinations thereof. For example, the carrier substrate 120' is made of III-V compound semiconductor material(s). Alternatively, the carrier substrate 120' may be a ceramic substrate, an SOI substrate, a multi-layered substrate, a gradient substrate, or the like.

In some embodiments, the carrier substrate 120' and the semiconductor substrate 111 of the IC die 110' are made of the same/similar semiconductor material(s). Alternatively, the material of the carrier substrate 120' is different from that of the semiconductor substrate 111 of the IC die 110'. In some embodiments, the carrier substrate 120' is a dummy substrate which is free of semiconductor devices. In other words, the carrier substrate 120' may not provide substantial function and thus may be a device-free substrate. Alternatively, the carrier substrate 120' includes semiconductor devices formed therein based on product requirements. The carrier substrate 120' may be provided at the wafer level. It is understood that other level (e.g., panel level, chip level, strip level, etc.) may be possible depending on the requirement of processing operations.

With continued reference to FIG. 1A, the carrier substrate 120' may include a first surface 120S1, a second surface 120S2 opposite to the first surface 120S1, and at least one cavity 120C recessed at the first surface 120S1. For example, the carrier substrate 120' includes a plurality of cavities 120C, and the respective cavity 120C is configured to accommodate at least one IC die 110' therein. It should be noted that although each of the IC dies placed within the one of the cavities is illustrated, the number of the IC dies disposed within the respective cavity may be one or more. For example, the IC dies disposed within the respective cavity may be the same type or different types.

Still referring to FIG. 1A, a thermally conductive layer 130 may be disposed within the cavity 120C and interposed between the carrier substrate 120' and the IC die 110'. For example, the thermally conductive layer 130 has a thermal conductivity ranging over about 3 W/m–K. It should be understood that the thermal conductivity of the thermally conductive layer may vary depending on product requirements and is not restricted in the disclosure. The thermally conductive layer 130 may be a single layer or may include a plurality of sublayers having different thermal conductivities. In some embodiments, the thermally conductive layer 130 is (or includes) a thermal interface material (TIM) which is an adhesive material having good thermal conductivity. For example, the thermally conductive layer 130 includes grease-based materials, phase-change materials, polymeric, gels, adhesives, film-type material, a combination thereof, or any suitable thermally conductive material. Depending on the type of material used, the thermally conductive layer 130 may be formed by printing, plating, dispensing, jetting, or any suitable deposition technique, and a curing process is optionally performed to form the thermally conductive layer 130.

In some embodiments, the thermally conductive layer 130 is initially formed in the cavity 120C of the carrier substrate 120', and then the IC die 110' is disposed in the cavity 120' and on the thermally conductive layer 130. In some embodiments, the thermally conductive layer 130 is initially formed on the sidewalls 110s and the rear surface 110r of the IC die 110', and then the IC die 110' is disposed in the cavity 120C of the carrier substrate 120'. The thermally conductive layer 130 lining the rear surface 110r and the sidewalls 110s of the IC die 110' may facilitate the thermal coupling between the carrier substrate 120' and the IC die 110'. For example, the thermally conductive layer 130 acts as an adhesive and functions to conduct the heat from IC die 110' to the carrier substrate 120'. In some embodiments, the thermally conductive layer 130 has a uniform thickness in the cavity 120 of the carrier substrate 120'. In some embodiments, a portion of the thermally conductive layer 130 formed on the sidewalls 110s of the IC die 110' and a portion of the thermally conductive layer 130 formed on the rear surface 110r of the IC die 110' have different thicknesses that depends on process variations and/or design requirements. For example, the thickness 130T of thermally conductive layer 130 ranges from about 10 μm to about 50 μm. It should be appreciated that the thickness of thermally conductive layer may vary depending on product requirements and is not intended to limit the embodiments.

Referring to FIG. 1B and also with reference to FIG. 1A, a singulation process may be performed on the carrier substrate 120' to form a plurality of die structures 100'. For example, the singulation process is performed by sawing along scribe lines SL1, and the sawing may dice individual die structure 100' from one another. In some embodiments, each of the die structures 100' includes at least one IC die 110' inlaid in the cavity 120C. It should be appreciated that any number of the IC die 110' and the cavity 120C may be included in the respective die structure 100'.

Figure 2A:
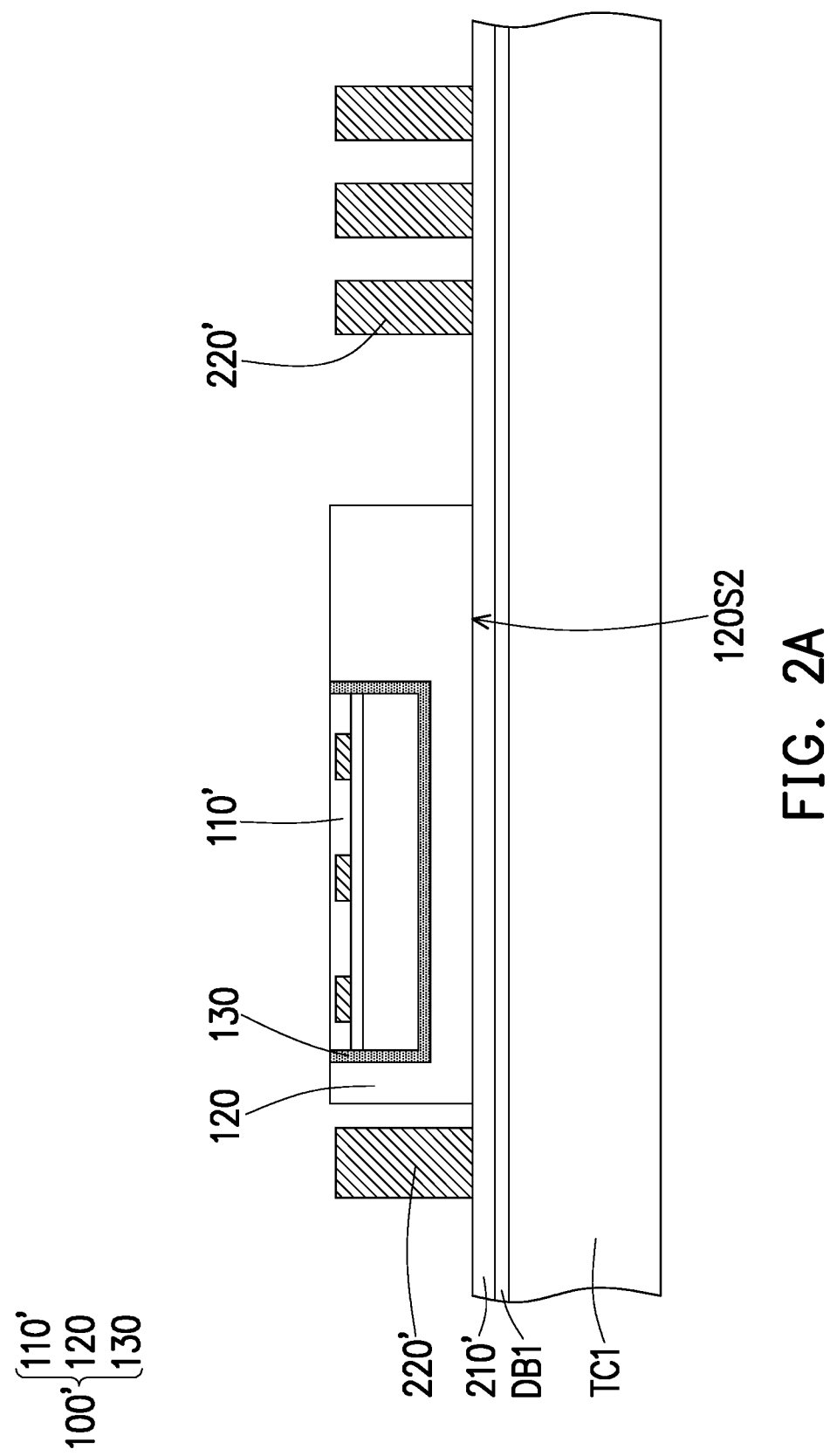
FIGS. 2A-2H are schematic cross-sectional views of various stages of manufacturing a package structure in accordance with some embodiments.

FIGS. 2A-2H are schematic cross-sectional views of various stages of manufacturing a package structure in accordance with some embodiments. Referring to FIG. 2A, a dielectric material layer 210' may be formed over a temporary carrier TC1. In some embodiments, the temporary carrier TC1 is provided with a de-bonding layer DB1, and the dielectric material layer 210' is formed on the de-bonding layer DB1. The material of the temporary carrier TC1 may include glass, plastic, metal, ceramic, and/or the like. In some embodiments, the temporary carrier TC1 is provided at the wafer level, such that multiple packages may be simultaneously formed thereon. The de-bonding layer DB1 may be formed of a polymer-based material, which may be removed along with the temporary carrier TC1 from the overlying structures that will be formed in subsequent steps. For example, the de-bonding layer DB1 is (or includes) a light-to-heat-conversion (LTHC) release layer, a ultra-violet (UV) glue layer, or the like. Alternatively, the de-bonding layer is omitted. In some embodiments, the dielectric material layer 210' is formed by any suitable technique such as spin-coating, lamination, deposition, or the like. In some embodiments, the dielectric material layer 210' includes a photo-sensitive material (e.g., PBO, PI, BCB, a combination thereof, or the like), a solder resist material, and/or any suitable dielectric material.

In some embodiments, a plurality of conductive pillars 220' is formed on the dielectric material layer 210'. For example, a seed material layer (not shown) is formed over the dielectric material layer 210'. The seed material layer may include a titanium/copper composite layer or the like, and may be formed by a sputtering process or any suitable deposition process. Thereafter, a photoresist (not shown) with openings is formed on the seed material layer, where the openings of the photoresist expose the intended locations for the later-formed conductive pillars 220'. Next, a plating process may be performed to form a conductive material layer (e.g., a copper layer) on the seed material layer exposed by the openings of the photoresist. Afterwards, the photoresist and the underlying seed material layer are then removed to form the conductive pillars 220'. The remaining seed material layer and the overlying conductive material layer may be collectively viewed as the respective conductive pillar 220'. Alternatively, the conductive pillars are pre-formed and disposed on the dielectric material layer through a placement process. In some embodiments, a portion of the conductive pillars 220' are configured to provide vertical and electrical connections in the semiconductor package, and a portion of the conductive pillars 220' are optionally arranged to form the dipole antenna or electrically coupled to ground.

With continued reference to FIG. 2A, the die structure 100' may be disposed on the dielectric material layer 210' through a pick-and-place process. The die structure 100' may be similar to the die structure 100' described in FIG. 1B, so the detailed descriptions are not repeated for simplicity. In some embodiments, the second surface 120S2 of the carrier substrate 120 is in direct contact with the dielectric material layer 210'. In some embodiments, the second surface 120S2 of the carrier substrate 120 is attached to the dielectric material layer 210' through a die attach film (not shown). In some embodiments, the formation of the conductive pillars 220' is performed prior to the placement of the die structure 100'. Alternatively, the die structure 100' is disposed on the dielectric material layer 210' before forming the conductive pillars 220'. For example, the die structure 100' is surrounded by the conductive pillars 220'. It is noted that the number and the arrangement of the die structure and the conductive pillars shown herein are merely examples and construe no limitation in the disclosure.

Figure 2B:
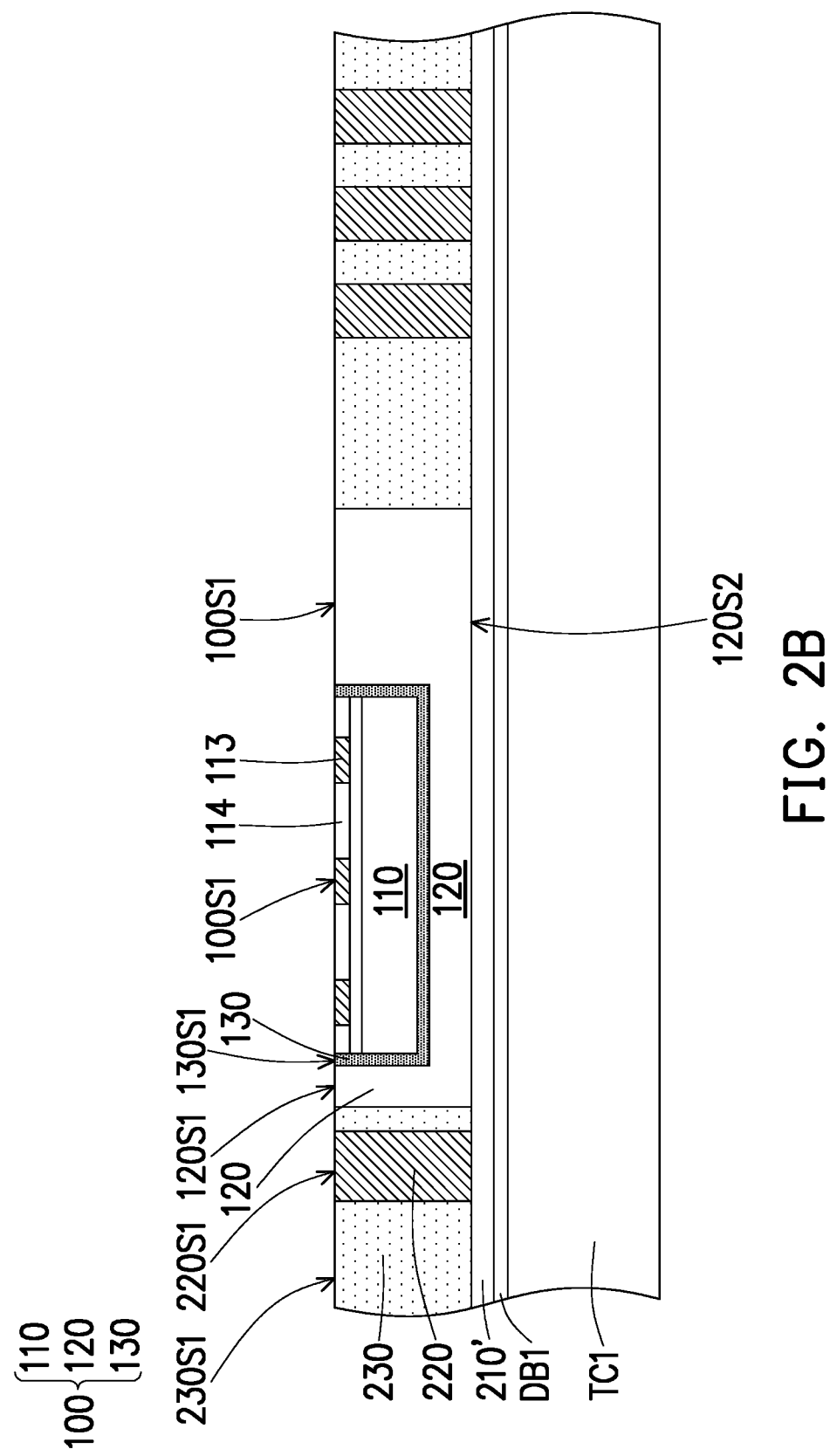

Referring to FIG. 2B and also with reference to FIG. 2A, an insulating encapsulation 230 is formed on the dielectric material layer 210'. For example, an insulating material (e.g., molding compound, epoxy resin, or the like) is formed on the dielectric material layer 210' by any suitable technique (e.g., compression molding, transfer molding, or the like), such that the die structure 100' and/or the conductive pillars 220' are buried in or covered by the insulating material. In some embodiments, the insulating material is applied in liquid or semi-liquid form and then subsequently cured. Subsequently, a planarization process (e.g., chemical-mechanical polishing (CMP), grinding, etching, a combination thereof, or the like) may be performed on the insulating material to form the insulating encapsulation 230. In some embodiments, the planarization process also removes a portion of the die structure 100' and/or the conductive pillars 220', until the die connectors 113 and the conductive pillars 220' are accessibly exposed by the insulating encapsulation 230, so as to form the die structure 100 and the conductive pillars 220.

As shown in FIG. 2B, the conductive pillars penetrating through the insulating encapsulation 230 may be viewed as through insulting vias (TIVs) 220. In some embodiments in which the protection layer 114 encapsulates the die connectors 113, during the planarization process, a portion of the protection layer 114 is removed to accessibly reveal the die connectors 113 for further electrical connection. During the planarization process, a portion of the thermally conductive layer 130 and/or a portion of the carrier substrate 120 may be removed together with the protection layer 114.

With continued reference to FIG. 2B, the die structure 100 may have the first surface 100S1 opposite to the second surface 100S2. The second surface 100S2 may be the second surface 120S2 of the carrier substrate 120. The first surface 100S1 may include the first surface (i.e. the major surface) 110S1 of the IC die 110, the first surface 120S1 of the carrier substrate 120, and the outermost surface 130S1 of the thermally conductive layer 130. For example, the first surface 100S1 of the die structure 100, the first surfaces 220S1 of the TIVs 220, and the first surface 230S1 of the insulating encapsulation 230 may be substantially coplanar (e.g., level) after the planarization process, within process variations. Alternatively, the planarization process may be omitted, if the die connectors and the conductive pillars are already exposed.

Figure 2C:
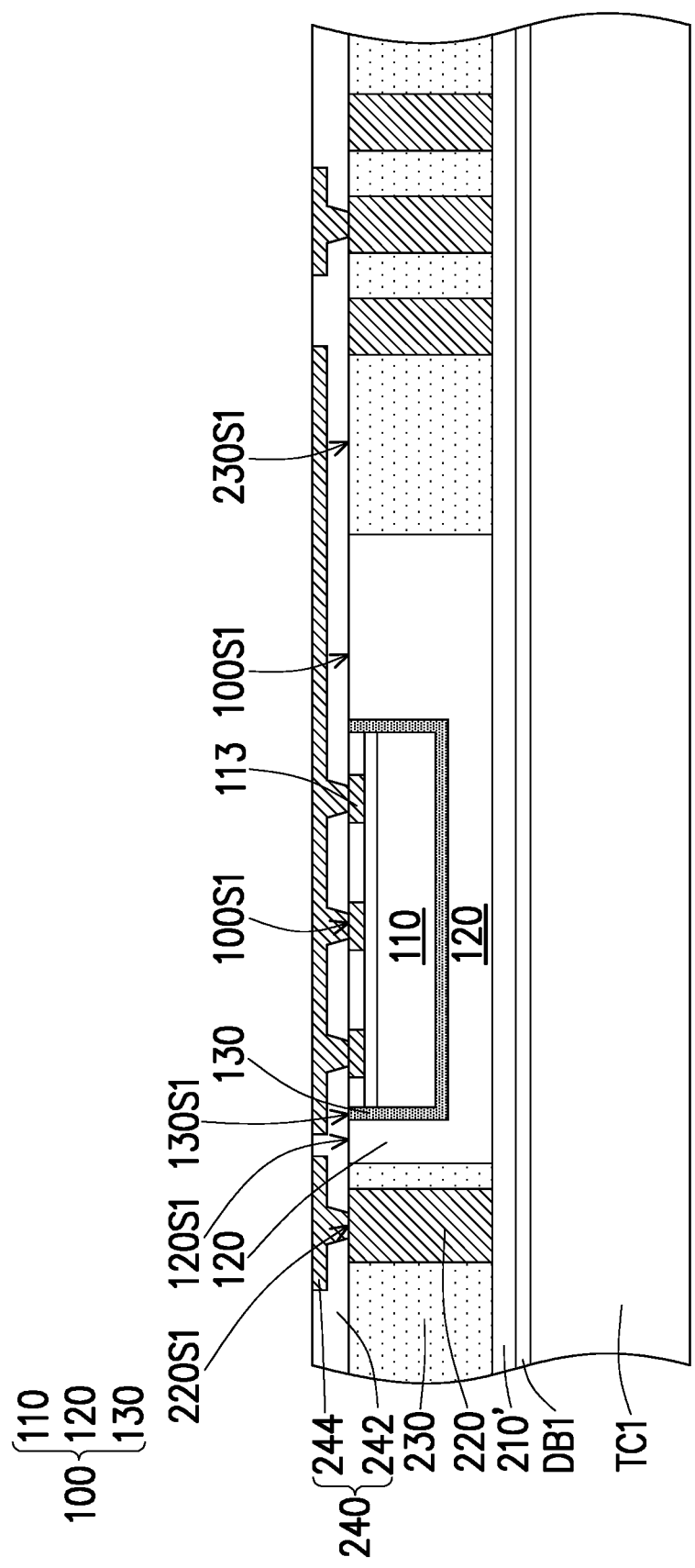

Referring to FIG. 2C, a redistribution structure 240 may be formed on the die structure 100, the TIVs 220, and the insulating encapsulation 230. The redistribution structure 240 may include at least one patterned dielectric layer 242 and at least one patterned conductive layer 244 embedded in the patterned dielectric layer 242. The patterned conductive layer 244 may include conductive lines, conductive vias, conductive pads, etc., and may be referred to as a redistribution layer (RDL). It should be appreciated that the redistribution structure 240 is shown as an example, and a plurality of patterned dielectric layers and patterned conductive layers may be alternately formed.

In some embodiments, the formation of the redistribution structure 240 starts with forming the patterned dielectric layer 242 on the first surface 100S1 of the die structure 100, the first surfaces 220S1 of the TIVs 220, and the first surface 230S1 of the insulating encapsulation 230. For example, the patterned dielectric layer 242 is formed of a photo-sensitive material such as PBO, PI, BCB, the like, or a combination thereof, which may be patterned using lithography and etching process or the like. The patterning may form openings exposing portions of the die connectors 113 and portions of the TIVs 220. The patterned dielectric layer 242 may be formed by other suitable technique(s). Thereafter, the patterned conductive layer 244 may be formed in the patterned dielectric layer 242. The patterned conductive layer 244 may include conductive vias extending through the patterned dielectric layer 242 to physically and electrically couple to the respective die connector 113 and the respective TIV 220. In some embodiments, the top surface of the patterned conductive layer 244 is substantially leveled with the top surface of the patterned dielectric layer 242. Alternatively, top portions (e.g., conductive lines and pads) of the patterned conductive layer 244 may be formed on the top surface of the patterned dielectric layer 242.

In some embodiments, a portion of the patterned conductive layer 244 serves as feed lines and another portion of the patterned conductive layer 244 serves as a ground plate for coupling the later-formed antenna structure. The IC die 110 of the die structure 100 may be electrically coupled to the TIVs 220 through the patterned conductive layer 244 of the redistribution structure 240. In some embodiments, a portion of the TIVs 220 is connected to the patterned conductive layer 244 for signal transmission, and another portion of the TIVs 220 may be electrically connected to the ground. Alternatively, all of the TIVs 220 are configured to transmit signals to/from the IC die 110.

Figure 2D:
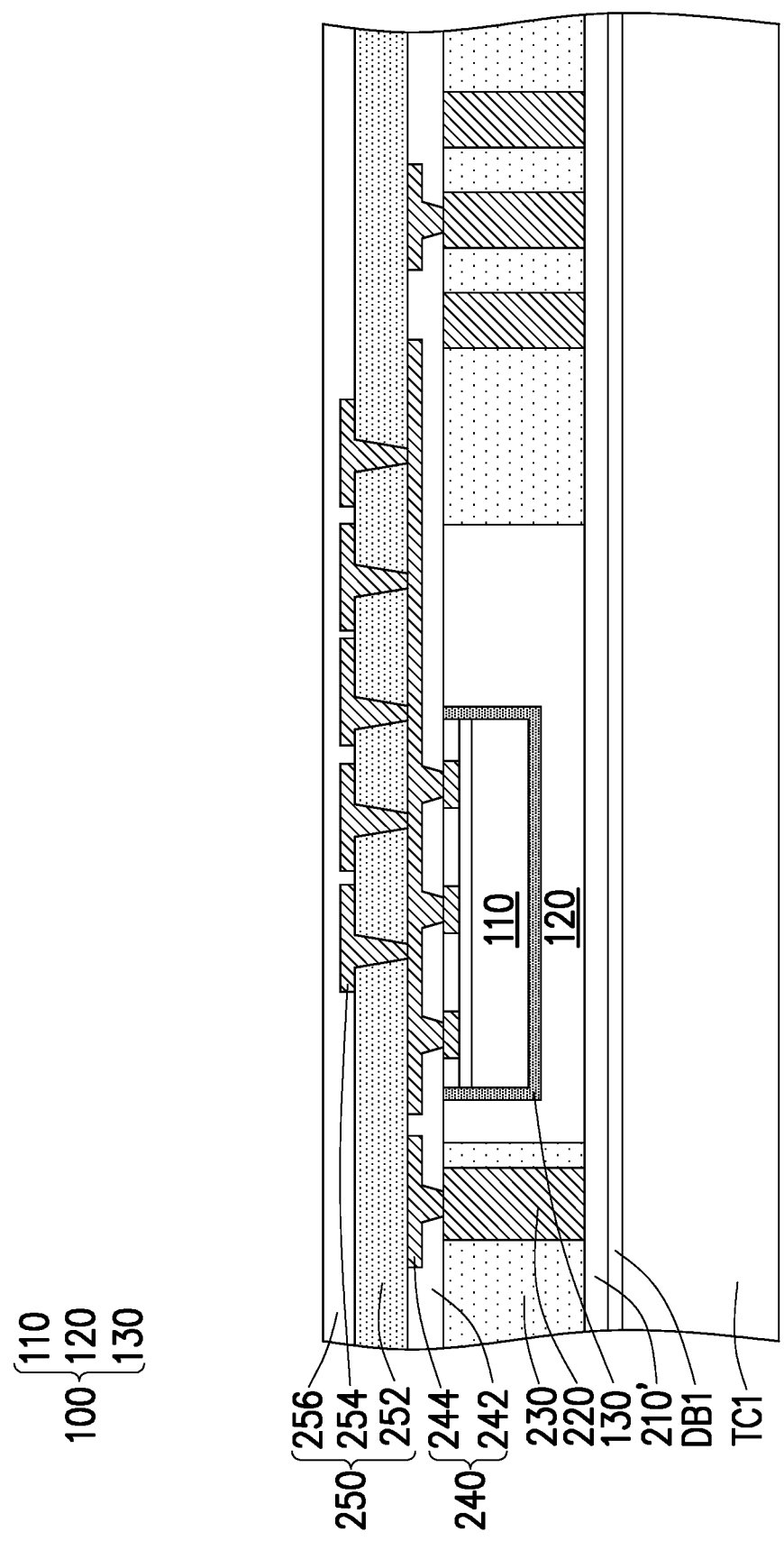

Referring to FIG. 2D, an antenna structure 250 may be formed on the redistribution structure 240. For example, the antenna structure 250 includes a first dielectric layer 252 and an antenna pattern 254 disposed on the first dielectric layer 252. In some embodiments, the first dielectric layer 252 formed on the redistribution structure 240 covers the patterned dielectric layer 242 and partially exposes the patterned conductive layer 244. In some embodiments, a dielectric material is deposited and patterned on the redistribution structure 240 to form the first dielectric layer 252. The first dielectric layer 252 may be (or include) a polymer layer (e.g., PBO, PI, BCB, a combination thereof, or the like). In some embodiments, the first dielectric layer 252 includes epoxy resins or any suitable type of molding materials. In some embodiments, the material of the first dielectric layer 252 is different from the material of the underlying patterned dielectric layer 242 of the redistribution structure 240. For example, the first dielectric layer 252 is made of one or more low dissipation factor (or called dielectric loss tangent, Df) material(s). In some embodiments, the Df value of the first dielectric layer 252 is less than 0.001. It should be understood that the value of Df is merely an example, depending on the frequency range of high-speed applications, suitable materials of the first dielectric layer 252 may be selected based on the required electrical properties of the package structure.

In some embodiments, the antenna pattern 254 is formed on the first dielectric layer 252 by plating, printing, dispensing, and/or any suitable technique. For example, the material of the antenna pattern 254 includes aluminum, titanium, copper, nickel, tungsten, and/or alloys thereof. The antenna pattern 254 may be electrically coupled to the IC die 110 of the die structure 100, for example, through the redistribution structure 240. In some embodiments, the antenna pattern 254 includes a first portion formed on the top surface of the first dielectric layer 252, and a second portion connected to the first portion and penetrating through the first dielectric layer 252. The second portion may be in physical and electrical contact with the patterned conductive layer 244. For example, the second portion is referred to as the conductive vias which are tapered from the first portion toward the patterned conductive layer 244. In some embodiments, the conductive vias of the antenna pattern 254 and the conductive vias of the patterned conductive layer 244 are tapered toward the same direction. Alternatively, the conductive vias of the antenna pattern and/or the conductive vias of the patterned conductive layer may have substantially vertical sidewalls. In some embodiments, the antenna pattern 254 is arranged in the form of an array on the top surface of the first dielectric layer 252. For example, the antenna pattern 254 is a patch antenna. Other types of antenna (e.g., ring antennas, rectangular loop antennas, monopole antennas, etc.) may be used depending on the device applications and/or frequency of operations.

In some embodiments, the antenna structure 250 includes a second dielectric layer 256 formed on the first dielectric layer 252 to encapsulate the antenna pattern 254 for protection. The second dielectric layer 256 may be a polymer layer which made of PI, PBO, BCB, or any other suitable polymer-based dielectric material. The second dielectric layer 256 may be formed by a suitable fabrication technique such as spin-coating, lamination, deposition, or the like. The material of the second dielectric layer 256 may be different from that of the underlying first dielectric layer 252. For example, the dielectric dissipation factor of the first dielectric layer 252 is lower than that of the second dielectric layer 256. Alternatively, the second dielectric layer 256 may be omitted.

Figure 2E:
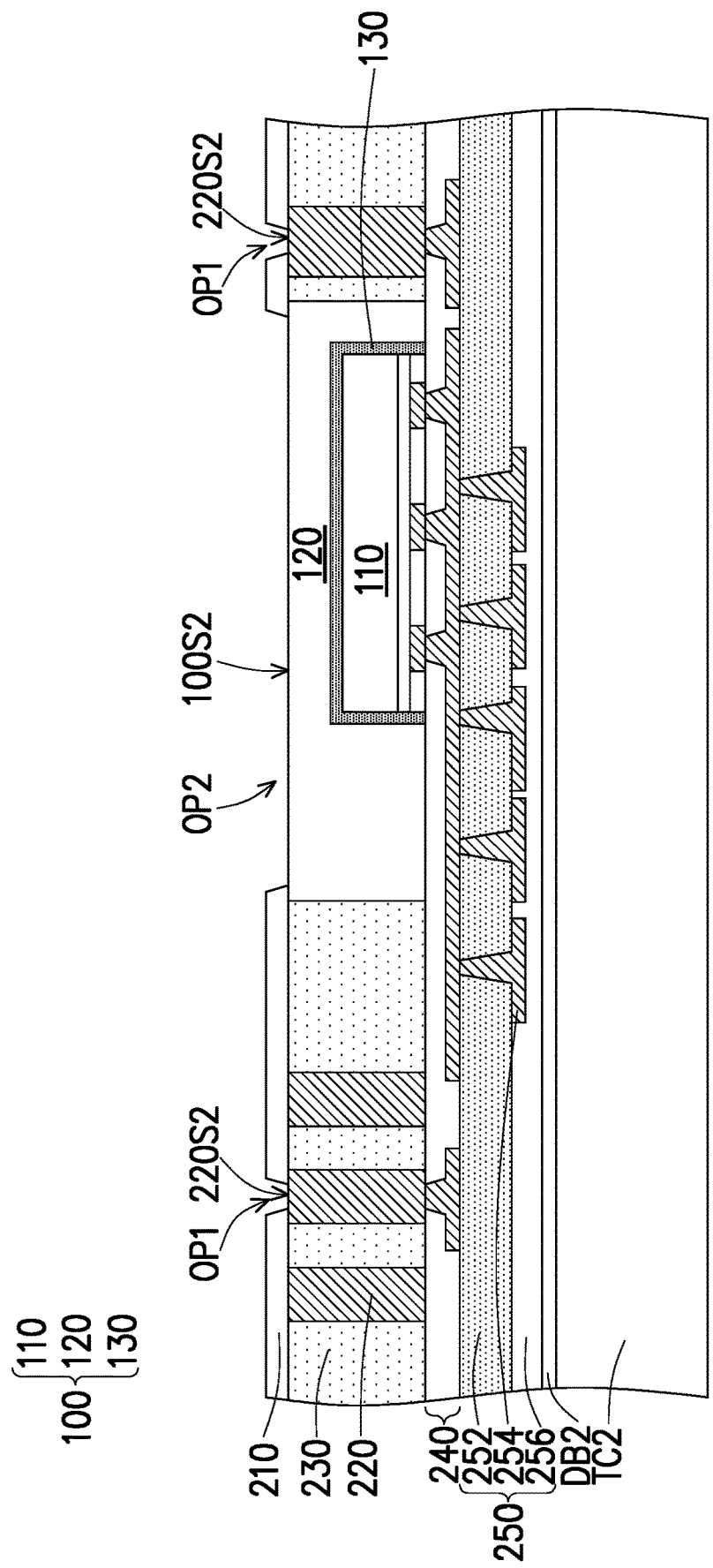

Referring to FIG. 2E and also with reference to FIG. 2D, a portion of the dielectric material layer 210' may be removed to form a patterned dielectric layer 210. For example, the temporary carrier TC1 is detached from the dielectric material layer 210' through a de-bonding process in order to accessibly expose the dielectric material layer 210'. For example, the de-bonding process includes projecting a light (e.g., laser light or an UV light) on the de-bonding layer DB1 so that the de-bonding layer DB1 decomposes and the temporary carrier TC1 may be removed. The de-bonding process may include grinding, peeling, etching, a combination thereof, or the like, in accordance with some embodiments.

In some embodiments, the structure of FIG. 2D is flipped (turned upside down) such that the dielectric material layer 210' faces upwards, and the antenna structure 250 may be placed over a temporary carrier TC2 for further processing. The flipping and the placement may be performed after the de-bonding of the temporary carrier TC1. Alternatively, the structure is flipped and disposed on the temporary carrier TC2 before the de-bonding of the temporary carrier TC1. In some embodiments, the second dielectric layer 256 of the antenna structure 250 is attached to the temporary carrier TC2 through a de-bonding layer DB2. The temporary carrier TC2 and the de-bonding layer DB2 may be similar to the temporary carrier TC1 and the de-bonding layer DB described in FIG. 2A, so the detailed descriptions are not repeated for the sake of brevity. Alternatively, the temporary carrier TC2 and/or the de-bonding layer DB2 may be omitted.

With continued reference to FIG. 2E, after the de-bonding the temporary carrier TC1, a portion of the dielectric material layer 210' is removed using such as lithography and etching or any suitable technique to form the patterned dielectric layer 210. In some embodiments, the patterned dielectric layer 210 includes a plurality of first openings OP1 and at least one second opening OP2. For example, portions of the second surfaces 220S2 of the TIVs 220 which are opposite to the first surfaces 220S1 (labeled in FIG. 2B) may be accessibly revealed by the first openings OP1 for further electrical connections. In some embodiments, the second surface 100S2 of the die structure 100 is accessibly revealed by the second opening OP2 of the patterned dielectric layer 210.

Still referring to FIG. 2E, the second surface 100S2 of the die structure 100 may include an exposed area surrounding by a covered area, where the exposed area is accessibly revealed by the second opening OP2 and the covered area is physically covered by the patterned dielectric layer 210. The exposed area may correspond to the IC die 110. Alternatively, the covered area is omitted so that the second surface 100S2 of the die structure 100 is fully exposed by the second opening OP2. In some embodiments, the patterned dielectric layer 210 has a plurality of the second openings (not shown) corresponding to hot spot regions of the die structure 100. It should be understood that the number, shape, size, and configuration of the second opening OP2 are not limited in the disclosure. Rather, those parameters of the second opening may be adjusted upon the design requirements. In some embodiments in which the second side of the carrier substrate is provided with the die attach film (not shown), the die attach film may be removed during the formation of the second opening OP2 in order to reveal the second surface 100S2 of the die structure 100. The periphery of the second surface 100S2 of the die structure 100 may (or may not) be physically covered by the remaining die attach film.

Figure 2F:
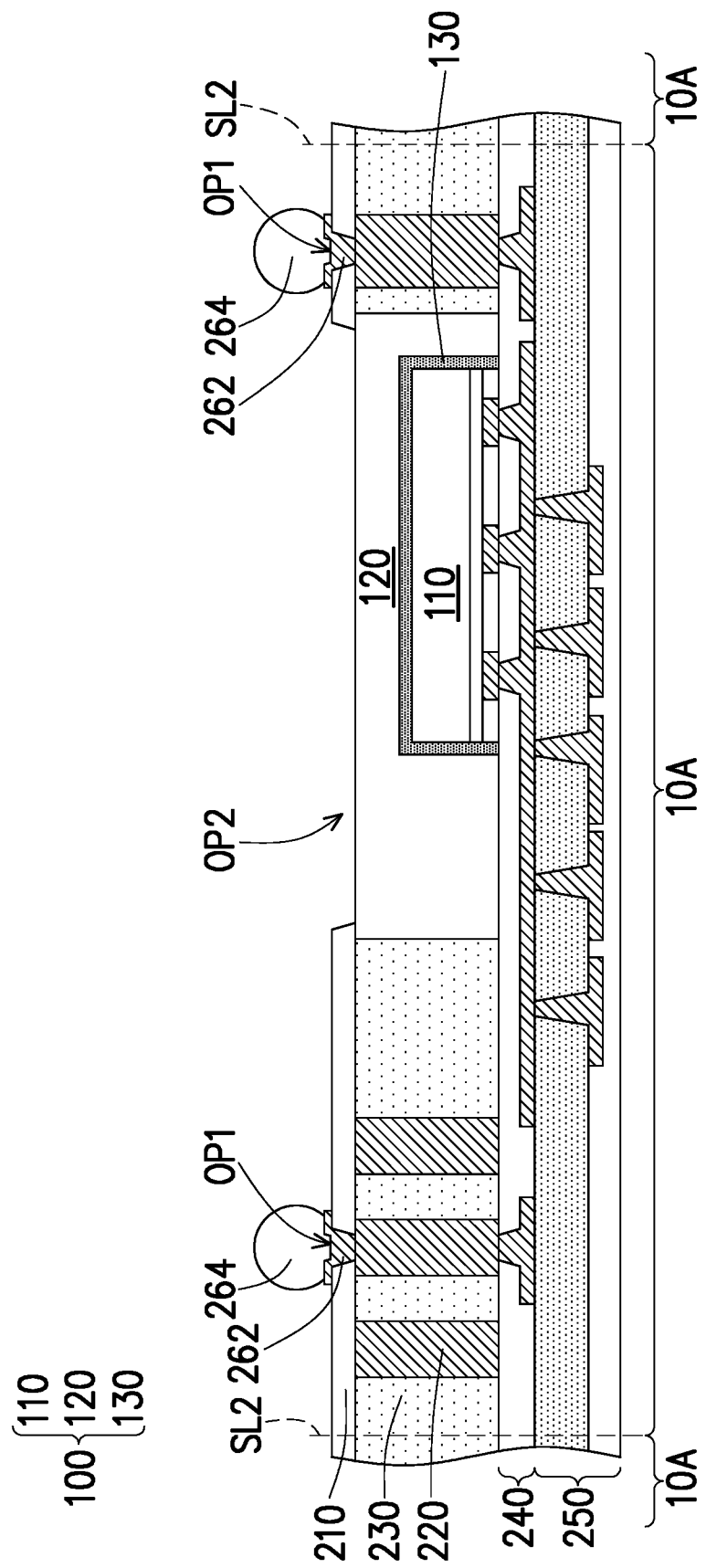

Referring to FIG. 2F, a plurality of conductive terminals 264 may be formed over the patterned dielectric layer 210 to be electrically coupled to the TIVs 220 through a conductive pattern 262. In some embodiments, the conductive pattern 262 is formed in the first openings OP1 of the patterned dielectric layer 210, and then the conductive terminals 264 are formed on the conductive pattern 262. For example, the conductive pattern 262 includes via portions which fill the first openings OP1 of the patterned dielectric layer 210 and are in electrical and direct contact with the TIVs 220. As shown in FIG. 2F, the via portions of the conductive pattern 262 and the via portions of the redistribution structure 240 are tapered along the opposing directions. In some embodiments, the via portions of the conductive pattern 262 and the via portions of the antenna pattern 254 may be tapered along the opposing directions. Alternatively, the via portions of the conductive pattern 262 may have substantially vertical sidewalls. In some embodiments, the conductive pattern 262 includes under-ball metallurgy (UBM) pads formed on the via portions. For example, the UBM pad includes multilayers of conductive materials, such as a layer of titanium, a layer of copper, and a layer of nickel. Other arrangements of materials and layers may be utilized for the formation of the UBM pads.

In some embodiments, the conductive terminals 264 are formed on the conductive pattern 262 (e.g., the UBM pads). The conductive terminals 264 may include a conductive material such as solder, copper, aluminum, gold, nickel, silver, palladium, tin, the like, or a combination thereof. In some embodiments, the conductive terminals 264 are formed by forming a solder layer through evaporation, plating, printing, solder transferring, ball placement, or the like. Once the solder layer has been formed, a reflow process may be performed to shape the solder layer into the desired bump shapes. Alternatively, the conductive terminals 264 include metal pillars formed by sputtering, printing, plating, or any suitable deposition process. The conductive terminals 264 may be (or may include) solder balls, metal bumps, controlled collapse chip connection (C4) bumps, electroless nickel-electroless palladium-immersion gold (ENEPIG) formed bumps, ball grid array (BGA) connectors, and/or the like. For example, the conductive terminals 264 are electrically coupled to the IC die 110 of the die structure 100 through the conductive pattern 262, the TIVs 220, and the redistribution structure 240.

With continued reference to FIGS. 2E-2F, the temporary carrier TC2 may be detached from the antenna structure 250 through the de-bonding process. The de-bonding process may be similar to the process performed on the temporary carrier TC1 described in FIGS. 2D-2E, so the detailed descriptions are not repeated for the sake of brevity. In some embodiments, a singulation process is performed to dice individual semiconductor packages 10A from one another. For example, the singulation process is performed by sawing along scribe lines SL2 to cut off the patterned dielectric layer 210, the insulating encapsulation 230, the redistribution structure 240, and the antenna structure 250. The carrier substrate 120 in the semiconductor package 10A may be in a predetermined proportion that allows for supporting the IC die 110 and aids in heat dissipation. It should be appreciated that the proportion of the carrier substrate in the semiconductor package may vary depending on product requirements and is not restricted in the disclosure. The outer sidewall 210W of the patterned dielectric layer 210, the outer sidewall 230W of the insulating encapsulation 230, the outer sidewall 240W of the redistribution structure 240, and the outer sidewall 250W of the antenna structure 250 may be substantially aligned and may be collectively viewed as the sidewall 10s of the semiconductor package 10A, as labeled in FIG. 2G. In some embodiments, the semiconductor package 10A is referred to as an integrated fan-out package.

Figure 2G:
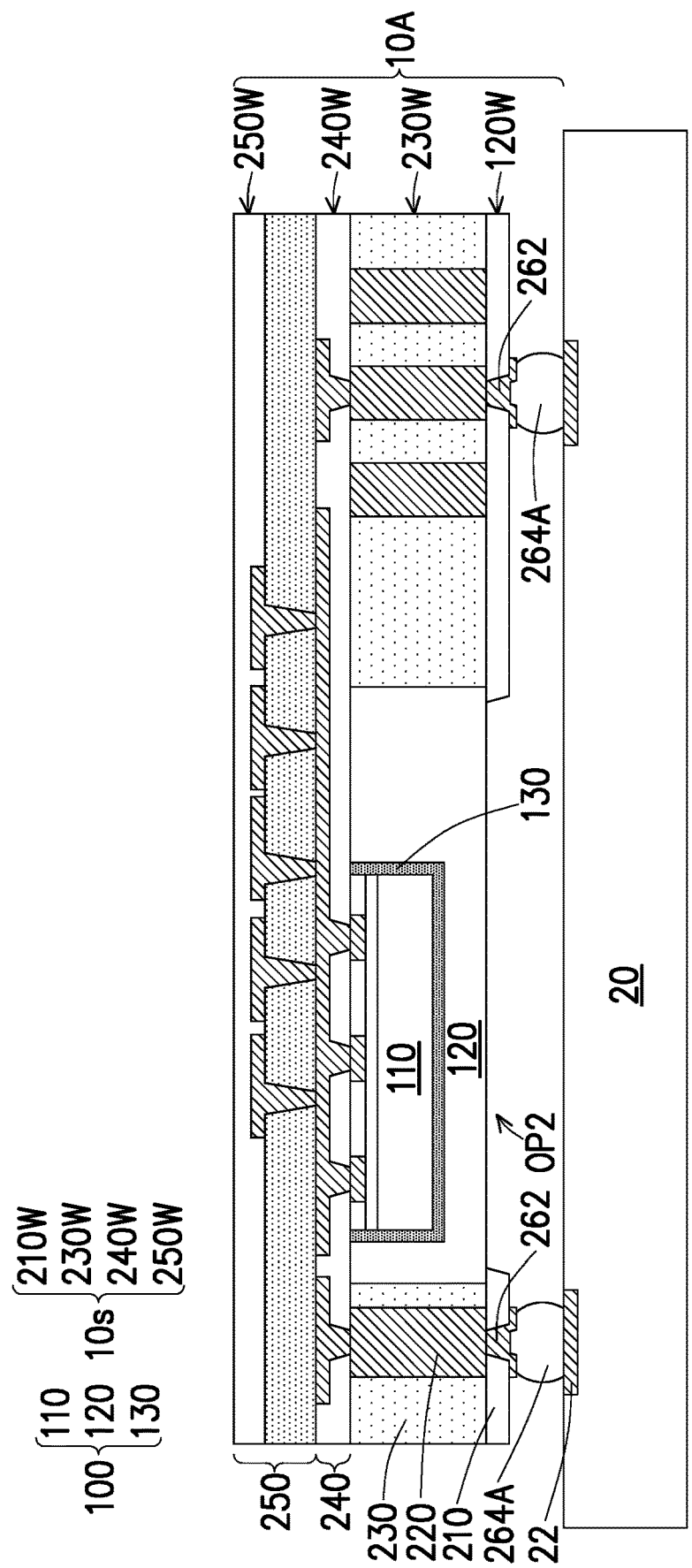

Referring to FIG. 2G and with reference to FIG. 2F, the semiconductor package 10A may be disposed on and electrically coupled to a circuit substrate 20. For example, the conductive terminals 264 are placed over contact pads 22 of the circuit substrate 20, and a reflow process may be performed on the conductive terminals 264 to form conductive joints 264A bonding the semiconductor package 10A to the circuit substrate 20. The circuit substrate 20 may be electrically coupled to the IC die 110 through the conductive joints 264A, the conductive pattern 262, the TIVs 220, and the redistribution structure 240. The circuit substrate 20 may be or may include a package substrate, an interposer, a printed circuit board (PCB), a mother board, a system board, and/or the like. In some embodiments, the circuit substrate 20 is replaced with another semiconductor package which includes the same or different types of IC die(s).

Figure 2H:
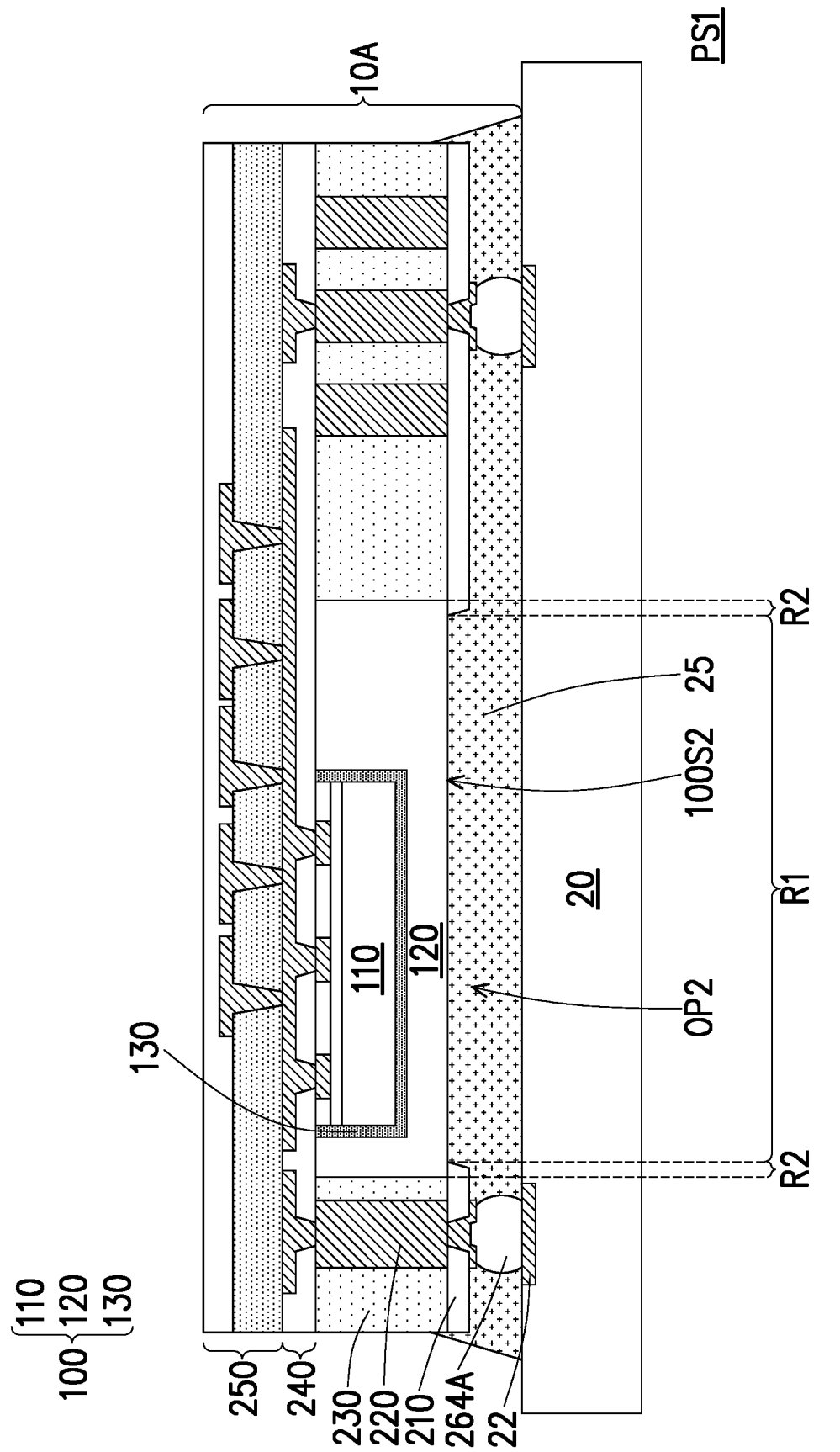

Referring to FIG. 2H, a thermally conductive underfill 25 may be formed between the semiconductor package 10A and the circuit substrate 20 and surround the conductive joints 264A. Up to here, a package structure PS1 is substantially complete. For example, after the semiconductor package 10A is attached to the circuit substrate 20, the thermally conductive underfill 25 is formed by a dispensing process or any suitable deposition method. Alternatively, the thermally conductive underfill 25 may be formed before the semiconductor package 10A is attached. The thermally conductive underfill 25 may include a liquid epoxy or polymer and then cured to harden. The thermally conductive underfill 25 may (or may not) include the thermally conductive fillers (not individually illustrated). As compared to the conventional underfill, the thermally conductive underfill 25 may have improved thermal conductivity for better heat dissipation. For example, the thermal conductivity of the thermally conductive underfill 25 ranges over about 0.45 W/mK. It should be understood that the thermal conductivity of the thermally conductive underfill may vary depend on product requirements.

With continued reference to FIG. 2H, the thermally conductive underfill 25 may fill the second opening OP2 to be in thermal and physical contact with the second surface 100S2 of the die structure 100. In some embodiments, the second surface 100S2 of the die structure 100 has a first region R1 covered by the thermally conductive underfill 25, and a second region R2 connected to the first region R1. The second region R2 may be the region which is not covered by the thermally conductive underfill 25 but covered by the patterned dielectric layer 210. The surface area of the first region R1 may be the contact area of the thermally conductive underfill 25 and the carrier substrate 120, and the surface area of the second region R2 may be the contact area of the patterned dielectric layer 210 and the carrier substrate 120. For example, the surface area of the first region R1 is substantially greater than the surface area of the second region R2. In some embodiments, a ratio of the surface area of the first region R1 to the total surface area of the second surface 100S2 is about ⅔, and a ratio of the surface area of the second region R2 to the total surface area of the second surface 100S2 is about ⅓. It is noted that the ratio values are merely example and may vary depending on product requirements.

In some embodiments, the thermally conductive underfill 25 extends from the gap between the semiconductor package 10A and the circuit substrate 20 to at least partially cover the sidewall 10s of the semiconductor package 10A. Depending on the amount of the thermally conductive underfill 25 that is dispensed, the thermally conductive underfill 25 may not cover the sidewall of the semiconductor package 10A. By configuring the thermally conductive underfill 25 thermally coupled to the die structure 100, using the carrier substrate 120 having a good thermal conductivity, and thermally coupling the IC die 110 to the carrier substrate 120 through the thermally conductive layer 130, the heat efficiency of the package structure PS1 may be improved. In some embodiments, the package structure PS1 including the antenna pattern 254 coupled to the IC die 110 (e.g., RFIC die) provides high performance operation for applications with operating frequencies up to the Terahertz (THz) range. During the operation of the package structure PS1, the heat generated from the IC die 110 may be dissipated through the thermally conductive layer 130, the carrier substrate 120, and the thermally conductive underfill 25 to external environment. In this manner, the heat generated in the die structure 100 of the package structure PS1 may be dissipated more efficiently.

Figure 3A:
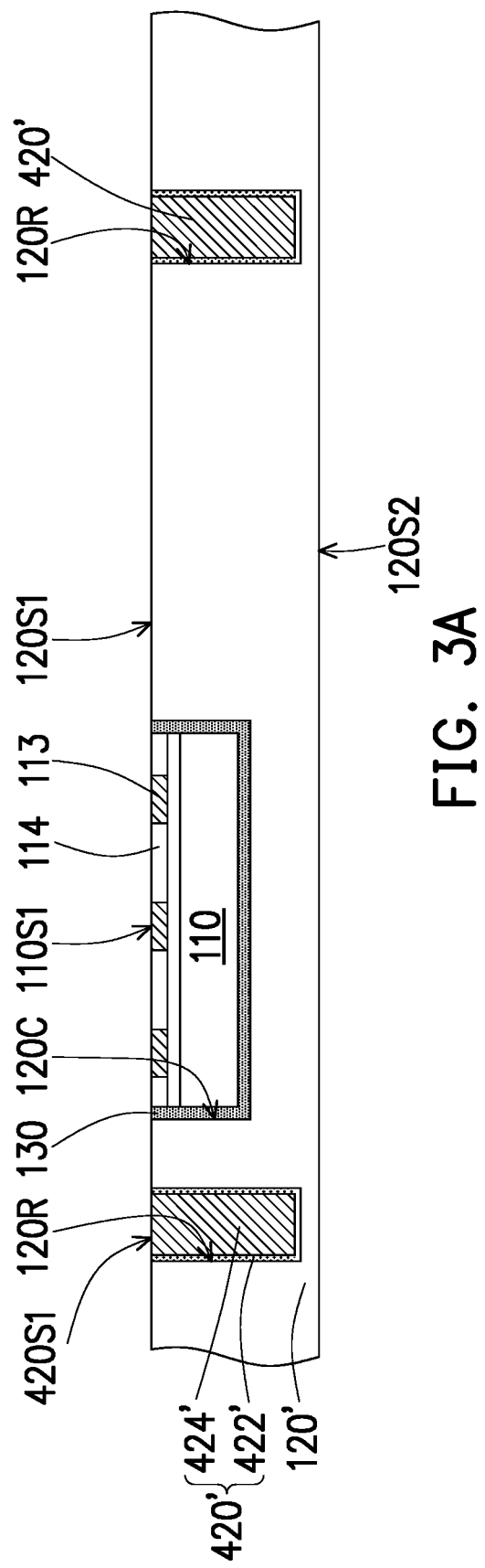
FIGS. 3A-3F are schematic cross-sectional views of various stages of manufacturing a package structure in accordance with some embodiments.

FIGS. 3A-3F are schematic cross-sectional views of various stages of manufacturing a package structure in accordance with some embodiments. Like elements in throughout the drawings are designated with the same reference numbers for ease of understanding and the details thereof are not repeated herein. Referring to FIG. 3A, at least one IC die 110 may be inlaid in the carrier substrate 120' and a plurality of conductive pillars 420' may be formed into the carrier substrate 120' to surround the IC die 110. For example, the IC die 110 is accommodated within the cavity 120C of the carrier substrate 120', and the thermally conductive layer 130 is disposed in the cavity 120C and separates the IC die 110 from the carrier substrate 120'. The carrier substrate 120', the IC die 110, and the thermally conductive layer 130 are similar to those of components described in FIGS. 1A-1B.

In some embodiments, the conductive pillars 420' are formed by forming recesses 120R in the carrier substrate 120' by such as etching, drilling, a combination thereof, or any suitable via-formation technique. In some embodiments, the formation of the recesses 120R and the cavity 120C may be performed at the same step. Alternatively, the formation of the recesses 120R may be performed before (or after) forming the cavity 120C. In some embodiments, a liner may (or may not) be conformally formed on the carrier substrate and to line the recesses 120R. The liner may include dielectric material such as an oxide, a nitride, and/or the like. Next, a diffusion barrier material may be conformally formed on the liner by suitable deposition process to line the recess 120R in order to prevent the conductive material (e.g., copper) from diffusing into the carrier substrate 120'. The diffusion barrier material may be formed of one or more layers of titanium, titanium nitride, tantalum, tantalum nitride, and/or the like. Next, a seed material may be conformally formed on the diffusion barrier material, and then a conductive material may be formed on the seed material and in the recesses 120R. The seed material may be a single layer or a composite layer including a plurality of sub-layers formed of different materials. For example, the seed material includes a titanium layer and a copper layer over the titanium layer. The conductive material may include copper, tungsten, aluminum, silver, gold, a combination thereof, or the like.

Thereafter, excess of the conductive material, the seed material, the diffusion barrier material, and the liner may be removed from the first surface 120S1 of the carrier substrate 120' by a planarization process (e.g., CMP, grinding, etching, a combination thereof, and/or the like). Remaining portions of the barrier material layer 422' and the conductive material layer 424' form the conductive pillars 420', where the barrier material layer 422' may include the remaining liner and the remaining diffusion barrier material (not individually illustrated), and the conductive material layer 424' may include the remaining seed material and the remaining conductive material (also not individually illustrated). It is noted that the configuration and the number of the conductive pillars 420' are merely example and construe no limitation in the disclosure.

In some embodiments, during the removal process of the excess materials, a portion of the protection layer 114 is removed to accessibly expose the die connectors 113. For example, the planarization process is performed such that the first surface 110S1 of the IC die 110, the first surface 120S1 of the carrier substrate 120', and the first surface 420S1 of the conductive pillars 420' may be substantially coplanar (e.g., level), within process variations. In some embodiments, the conductive pillars 420' at this stage are not yet exposed at the second surface 120S2 (e.g., the backside) of the carrier substrate 120'. Rather, the conductive pillars 420' are buried in the carrier substrate 120'.

Figure 3B:
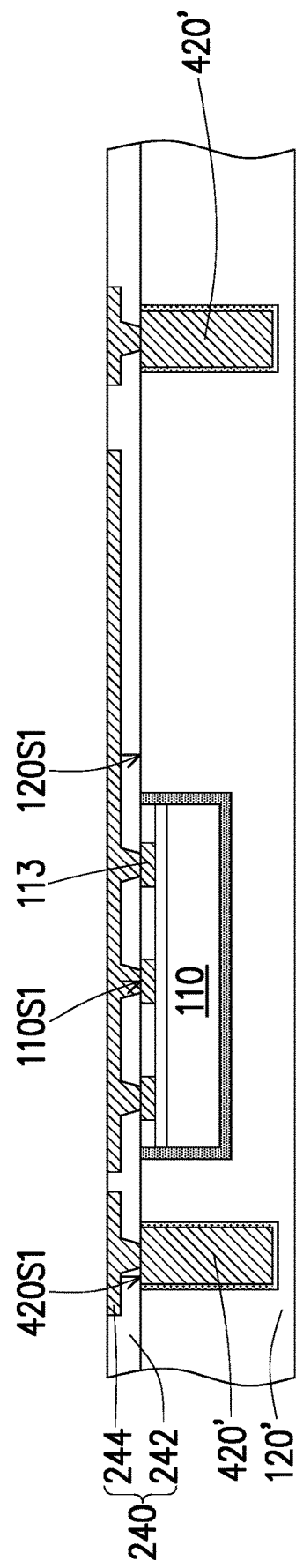

Referring to FIG. 3B, the redistribution structure 240 including the patterned dielectric layer 242 and the patterned conductive layer 244 may be formed on the IC die 110, the carrier substrate 120', and the conductive pillars 420'. For example, the patterned dielectric layer 242 is formed on the first surface 120S1 of the carrier substrate 120' and partially covers the first surface 420S1 of the conductive pillars 420' and the first surface 110S1 of the IC die 110. The patterned conductive layer 244 may be embedded in the patterned dielectric layer 242 and physically and electrically connected to the conductive pillars 420' and the die connectors 113 of the IC die 110. For example, the IC die 110 is electrically coupled to the conductive pillars 420' through the patterned conductive layer 244 of the redistribution structure 240. The materials and the forming processes of the redistribution structure 240 may be similar to those of the redistribution structure 240 described in FIG. 2C, so the detailed descriptions are not repeated for the sake of brevity.

Figure 3C:
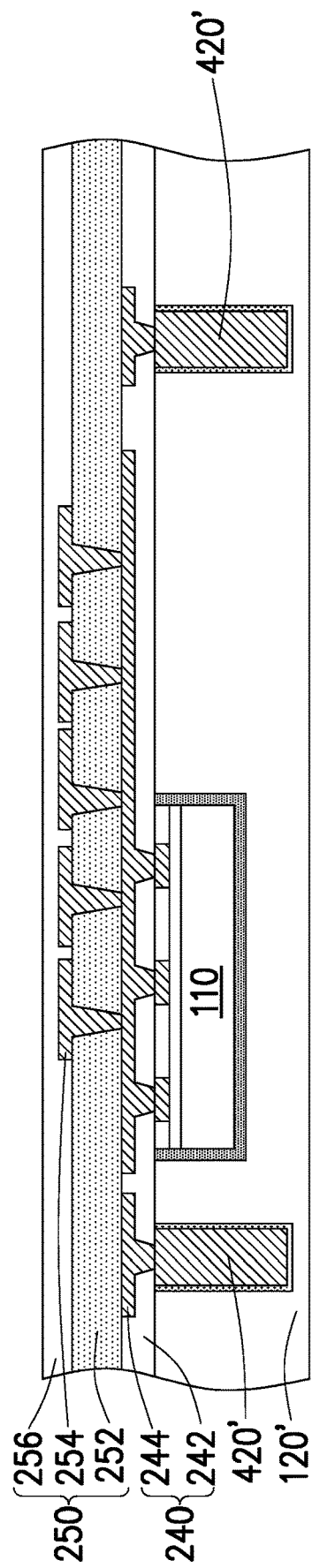

Referring to FIG. 3C, the antenna structure 250 including the first dielectric layer 252, the antenna pattern 254, and the second dielectric layer 256 may be formed on the redistribution structure 240. The antenna pattern 254 may be electrically coupled to the IC die 110 at least through the patterned conductive layer 244 of the redistribution structure 240. The materials and the forming processes of the antenna structure 250 may be similar to those of the antenna structure 250 described in FIG. 2D, so the detailed descriptions are not repeated for the sake of brevity.

Figure 3D:
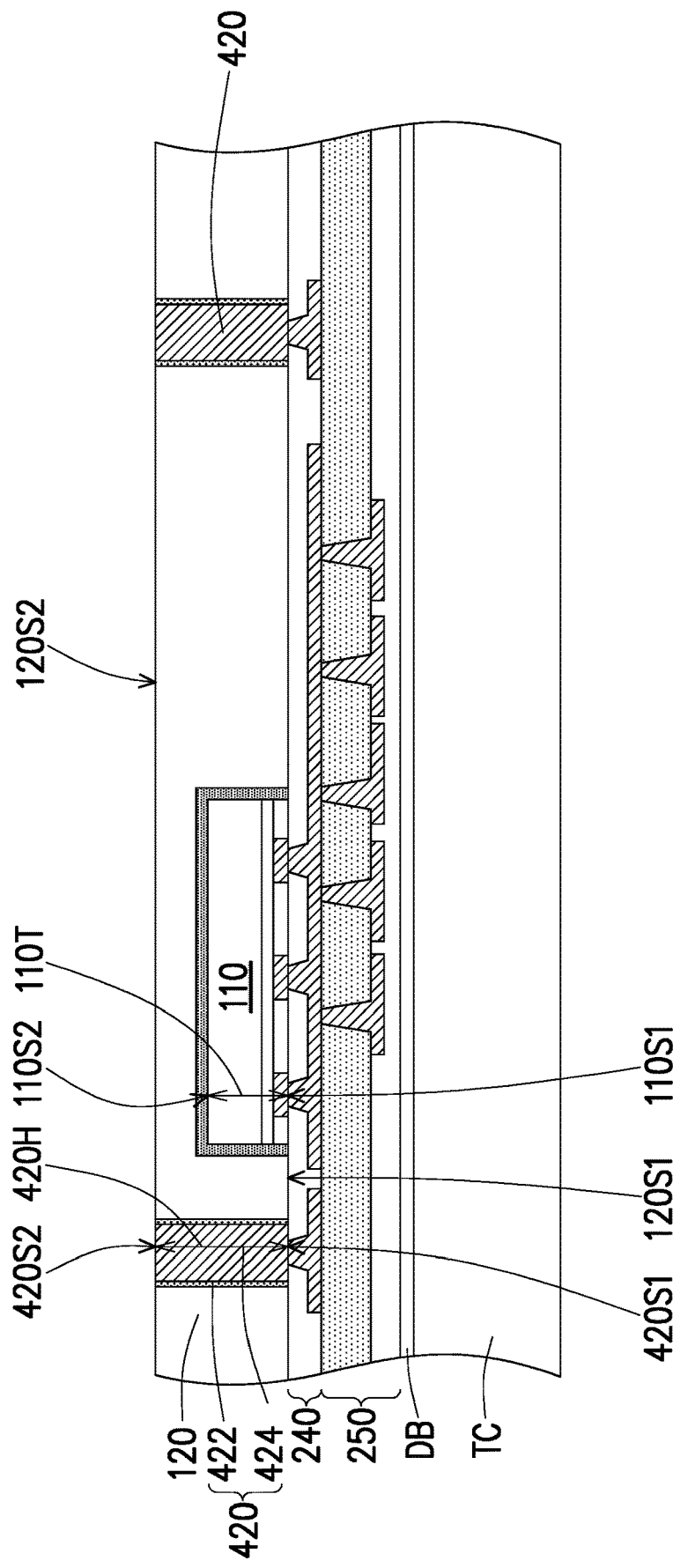

Referring to FIG. 3D and also with reference to FIG. 3C, the conductive pillars 420' may be accessibly exposed at the backside of the carrier substrate 120'. After exposure, the conductive pillars may be referred to as through-substrate vias (TSVs) 420. For example, the respective TSV 420 includes the barrier layer 422 and the conductive layer 424 laterally covered by the barrier layer 422. In some embodiments, a backside thinning process (e.g., CMP, grinding, etching, a combination thereof, or the like) is performed on the carrier substrate 120' to form the carrier substrate 120. In some embodiments, the structure of FIG. 3C is flipped, such that the backside of the carrier substrate 120' faces upwardly for processing. The antenna structure 250 may be placed over the temporary carrier TC for supporting. In some embodiments, the temporary carrier TC is provided with the de-bonding layer DB, and the antenna structure 250 is attached to the de-bonding layer DB. The temporary carrier TC and the de-bonding layer DB may be similar to the temporary carrier TC1 and the de-bonding layer DB1 described in FIG. 2A. Alternatively, the temporary carrier TC and/or the de-bonding layer DB may be omitted, and the structure of FIG. 3C may not be flipped during the thinning process.

In some embodiments, during the thinning process, a portion of the conductive pillars 420' is removed until the conductive material layer is exposed for electrical connection. After the thinning process, the second surfaces 420S2 of the TSVs 420 and the second surface 120S2 of the carrier substrate 120 may be substantially coplanar (e.g., level) within process variations. The height 420H of the respective TSV 420 measured between the first surface 420S1 and the second surface 420S2 may be greater than the thickness 110T of the IC die 110 measured between the first surface 110S1 and the second surface 110S2 (i.e. the rear surface of the IC die 110). As shown in FIG. 3D, the second surface 110S2 is located between the first surface 110S1 and the second surface 120S2 of the carrier substrate 120, where the second surface 120S2 is substantially leveled with the second surfaces 420S2 of the TSVs 420.

Figure 3E:
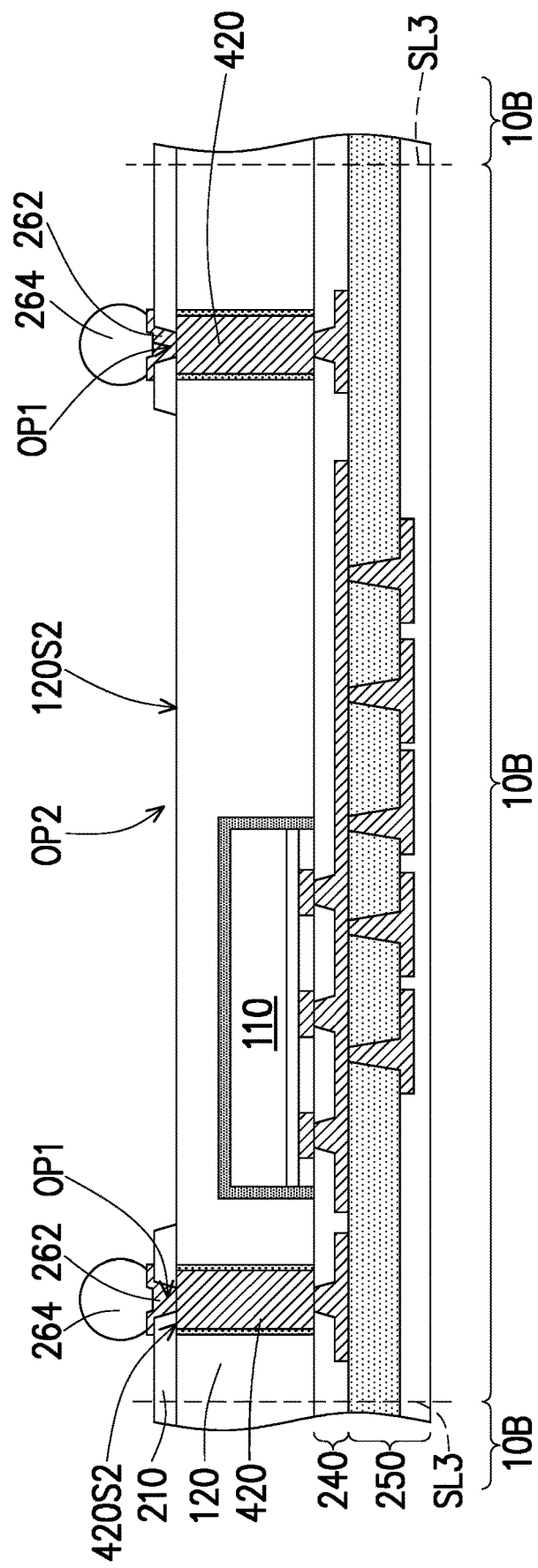

Referring to FIG. 3E, the patterned dielectric layer 210 may be formed on the carrier substrate 120 and partially expose the TSVs 420. For example, at least a portion of the second surface 420S2 of the respective TSV 420 is accessibly exposed by the first opening OP1 of the patterned dielectric layer 210, and a portion of the second surface 120S2 of the carrier substrate 120 is accessibly exposed by the second openings OP2 of the patterned dielectric layer 210. In some embodiments, the conductive pattern 262 is formed on the patterned dielectric layer 210 and extends into the patterned dielectric layer 210 to be in physical and electrical contact with the underlying TSVs 420. In some embodiments, the conductive terminals 264 are formed on the conductive pattern 262 (e.g., the UBM pads) to be electrically coupled to the TSVs 420. The materials and the formation of the patterned dielectric layer 210, the conductive pattern 262, and the conductive terminals 264 may be similar to those of the patterned dielectric layer 210, the conductive pattern 262, and the conductive terminals 264 described in FIGS. 2E-2F, so the detailed descriptions are omitted for simplicity.

With continued reference to FIG. 3E and also referring to FIG. 3D, the singulation process may be performed to dice individual semiconductor packages 10B from one another. The temporary carrier TC may be detached from the antenna structure 250 through the de-bonding process before (or after) the singulation process. The de-bonding process may be similar to the de-bonding process performed on the temporary carrier TC1 described in FIGS. 2D-2E, so the detailed descriptions are not repeated for the sake of brevity. The singulation process may be performed by sawing along scribe lines SL3 to cut off the patterned dielectric layer 210, the carrier substrate 120, the redistribution structure 240, and the antenna structure 250. The outer sidewall 210W of the patterned dielectric layer 210, the outer sidewall 120W of the carrier substrate 120, the outer sidewall 240W of the redistribution structure 240, and the outer sidewall 250W of the antenna structure 250 may be substantially aligned and may be collectively viewed as the sidewall 10s' of the semiconductor package 10B, as labeled in FIG. 3F.

Figure 3F:
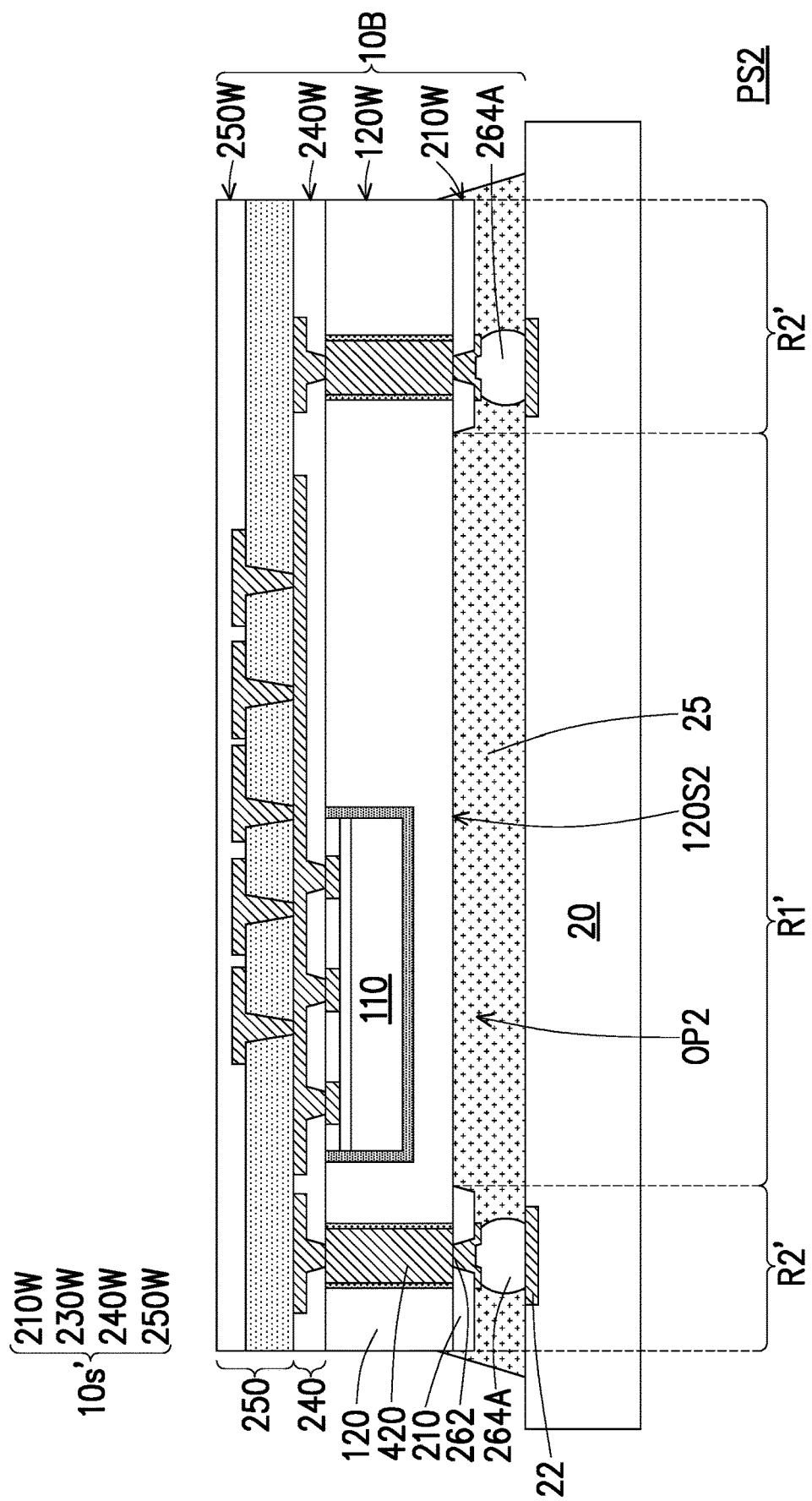

Referring to FIG. 3F and with reference to FIG. 3E, the semiconductor package 10B may be disposed on and electrically coupled to the circuit substrate 20. For example, the conductive terminals 264 are placed over the contact pads 22 of the circuit substrate 20, and a reflow process may be performed on the conductive terminals 264 to form conductive joints 264A coupling the semiconductor package 10B to the circuit substrate 20. In some embodiments, the thermally conductive underfill 25 is then formed between the semiconductor package 10B and the circuit substrate 20 to surround the conductive joints 264A. For example, the thermally conductive underfill 25 fills the second opening OP2 of the patterned dielectric layer 210 to be in thermal and direct contact with the second surface 120S2 of the carrier substrate 120. Depending on the applied amount of the thermally conductive underfill 25, the thermally conductive underfill 25 may (or may not) cover the sidewall 10s' of the semiconductor package 10B. The circuit substrate 20 and the thermally conductive underfill 25 may be similar to the circuit substrate 20 and the thermally conductive underfill 25 described in FIGS. 2G-2H, so the detailed descriptions are omitted for simplicity. Up to here, the fabrication of a package structure PS2 is substantially complete.

As shown in FIG. 3F, the second surface 120S2 of the carrier substrate 120 has the first region R1' covered by the thermally conductive underfill 25, and the second region R2' connected to the first region R1'. The second region R2' may be the region which is not covered by the thermally conductive underfill 25 or may include the region covered by the patterned dielectric layer 210. For example, the surface area of the first region R1' is substantially greater than the surface area of the second region R2'. In some embodiments, a ratio of the surface area of the first region R1' to the total surface area of the second surface 120S2 is about ⅔, and a ratio of the surface area of the second region R2' to the total surface area of the second surface 120S2 is about ⅓. It is noted that the ratio values are merely examples and may vary depending on product requirements.

The heat efficiency of the package structure PS2 may be improved by, for example, using the carrier substrate 120 with a good thermal conductivity, thermally coupling the IC die 110 to the carrier substrate 120 through the thermally conductive layer 130, and thermally coupling the carrier substrate 120 to the thermally conductive underfill 25, etc. For example, during the operation, the heat generated from the IC die 110 may be dissipated through the thermally conductive layer 130, the carrier substrate 120, and the thermally conductive underfill 25 to external environment. In this manner, the package structure PS2 may have improved thermal conductivity between the semiconductor package 10B and the circuit substrate 20.

FIGS. 4-7 are schematic cross-sectional views showing variations of a package structure in accordance with some embodiments. Unless specified otherwise, the materials and the formation methods of the components in these embodiments are essentially the same as the like components, which are denoted by like reference numerals in the embodiments shown in FIGS. 2A-2H and FIGS. 3A-3F. The details regarding the formation process and the materials of the components shown in FIGS. 4-7 may thus be found in the discussion of the embodiments shown in FIGS. 2A-2H and FIGS. 3A-3F.

Figure 4:
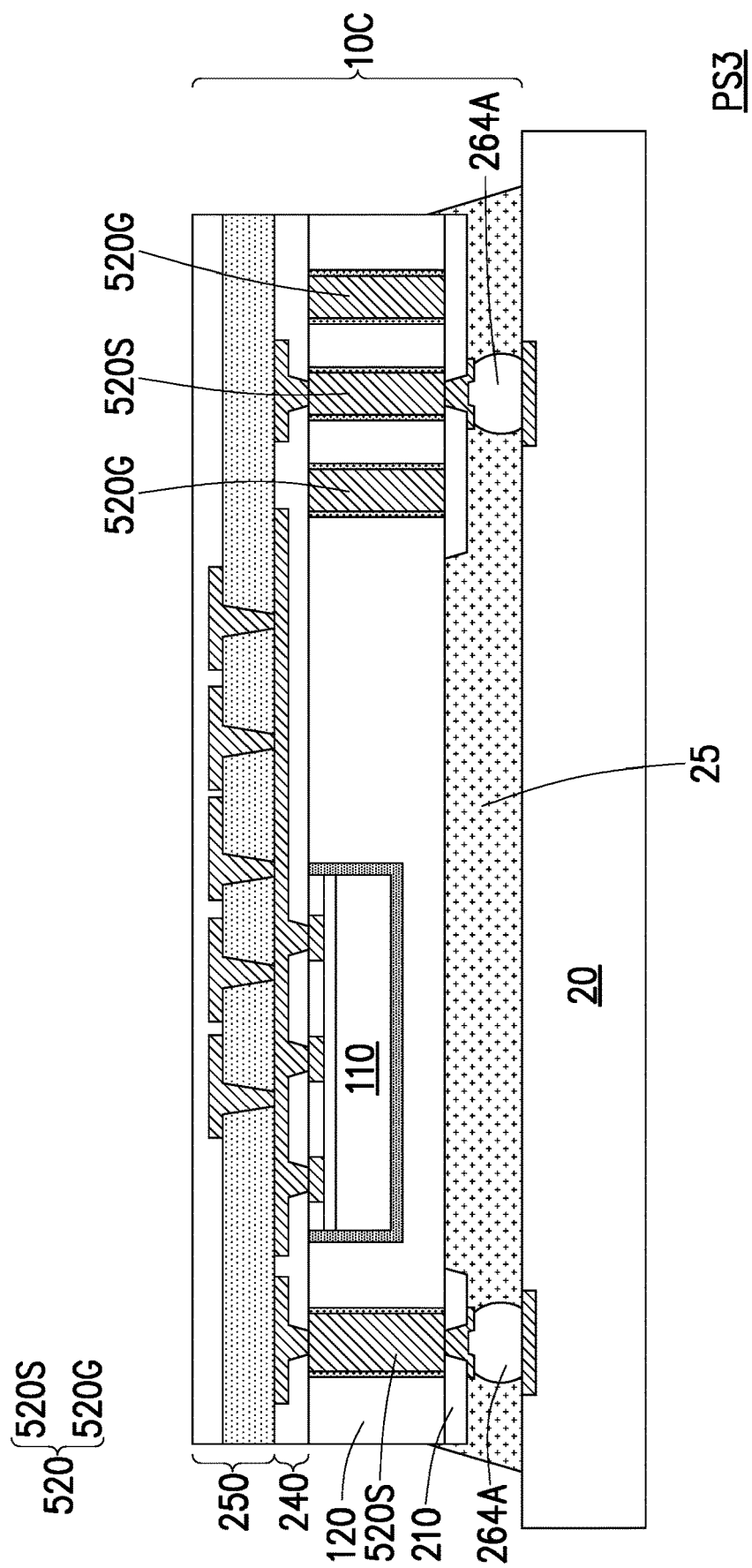
FIGS. 4-7 are schematic cross-sectional views showing variations of a package structure in accordance with some embodiments.

Referring to FIG. 4 and with reference to FIG. 3F, a package structure PS3 including a semiconductor package 10C bonded to the circuit substrate 20 is provided. The semiconductor package 10C includes the IC die 110 embedded in the carrier substrate 120 and electrically coupled to the antenna structure 250. The package structure PS3 may be similar to the package structure PS2 shown in FIG. 3F, and the difference therebetween lies in that the semiconductor package 10C of the package structure PS3 includes a first portion 520S of the TSVs 520 adapted for signal/power transmission, and a second portion 520G of the TSVs 520 electrically coupled to electrical ground. On the other hand, the TSVs 420 of the package structure PS2 shown in FIG. 3F may be adapted for signal/power transmission. The materials and the formation of the TSVs 520 may be similar to those of the TSVs 420. The TSVs 520 may be arranged horizontally, vertically, diagonally, in a zig zag fashion, or randomly, depending on circuit designs. It should be noted that the number and the arrangement of the TSVs may vary depending on the requirements and are not restricted in the disclosure.

Figure 5:
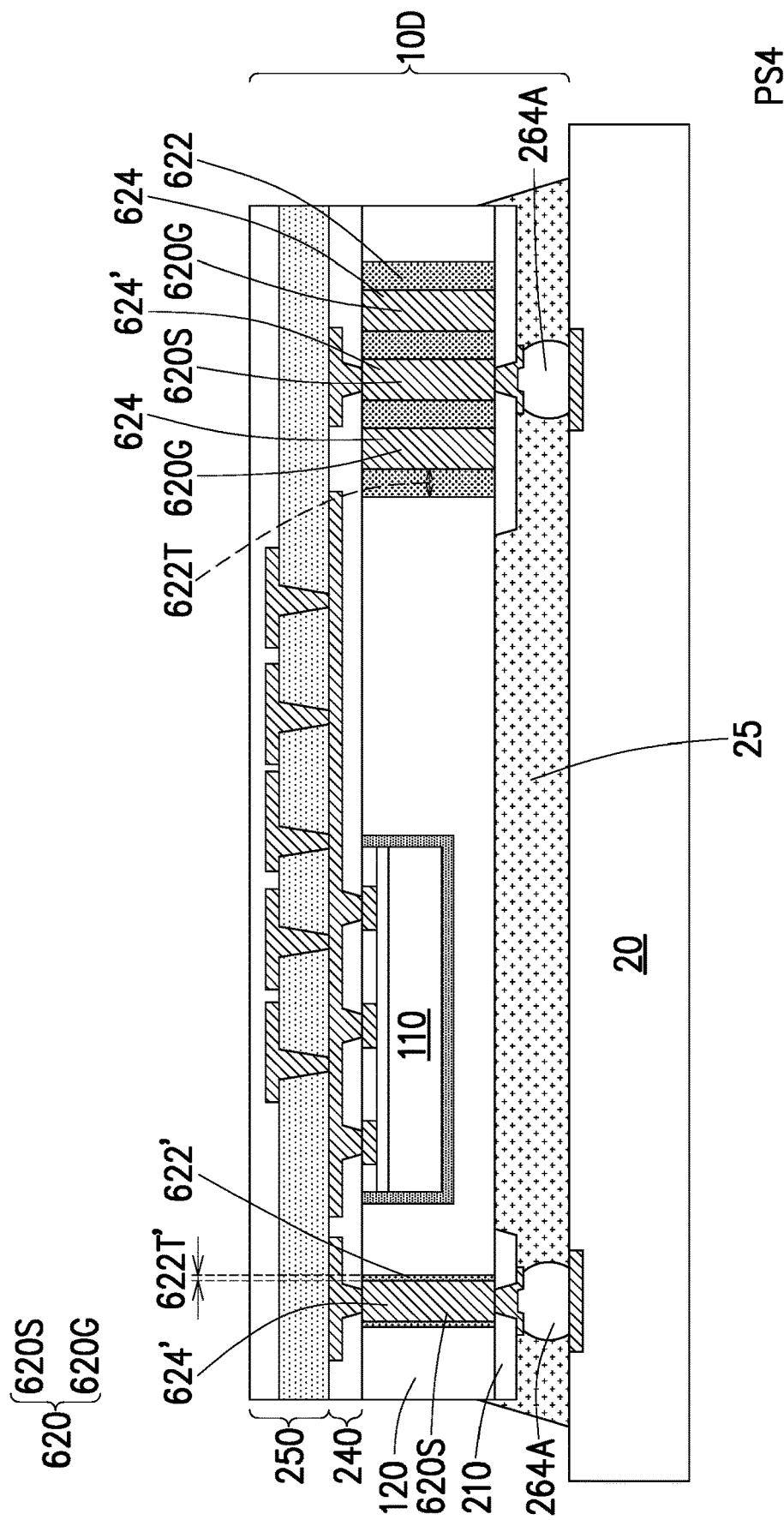

Referring to FIG. 5, a package structure PS4 including a semiconductor package 10D bonded to the circuit substrate 20 is provided. The semiconductor package 10D includes the IC die 110 embedded in the carrier substrate 120 and electrically coupled to the antenna structure 250. The package structure PS4 may be similar to the package structure PS3 shown in FIG. 4, and the difference therebetween lies in that the semiconductor package 10D of the package structure PS4 includes the TSV structure 620 surrounding the IC die 110. In some embodiments, the TSVs 620 include the barrier layer 622 (or 622') and the conductive layer 624 (or 624') laterally covered by the barrier layer 622 (or 622'). The materials and the formation of the barrier layers (622 and 622') and the conductive layers (624 and 624') may be similar to those of the barrier layer 422 and the conductive layer 424 described in FIGS. 3A-3D. In some embodiments, the barrier layers (622 and 622') are of the same/similar material(s), but have different thicknesses. For example, the thickness 622T' of the barrier layer 622' is substantially less than the thickness 622T of the barrier layer 622.

The TSV structure 620 may include a first portion 620S configured to transmit signal/power to/from the IC die 110, and a second portion 620G electrically coupled to electrical ground. In some embodiments, the barrier layer 622' having the thinner thickness laterally covers the conductive layer 624' which is adapted for signal/power transmission. In some embodiments, the barrier layer 622 having the thicker thickness laterally encapsulates the conductive layer 624 which is electrically coupled to electrical ground. In some embodiments, the barrier layer 622 having the thicker thickness is interposed between the conductive layers 624 and 624', where the conductive layer 624 is electrically coupled to electrical ground and the conductive layer 624' is adapted for signal/power transmission. For example, the second portion 620G may serve as a shielding layer in the TSV structure 620. Alternatively, the TSV structure includes the barrier layer laterally covering the conductive layer and having the uniform thickness (e.g., as shown in FIG. 4).

Figure 6:
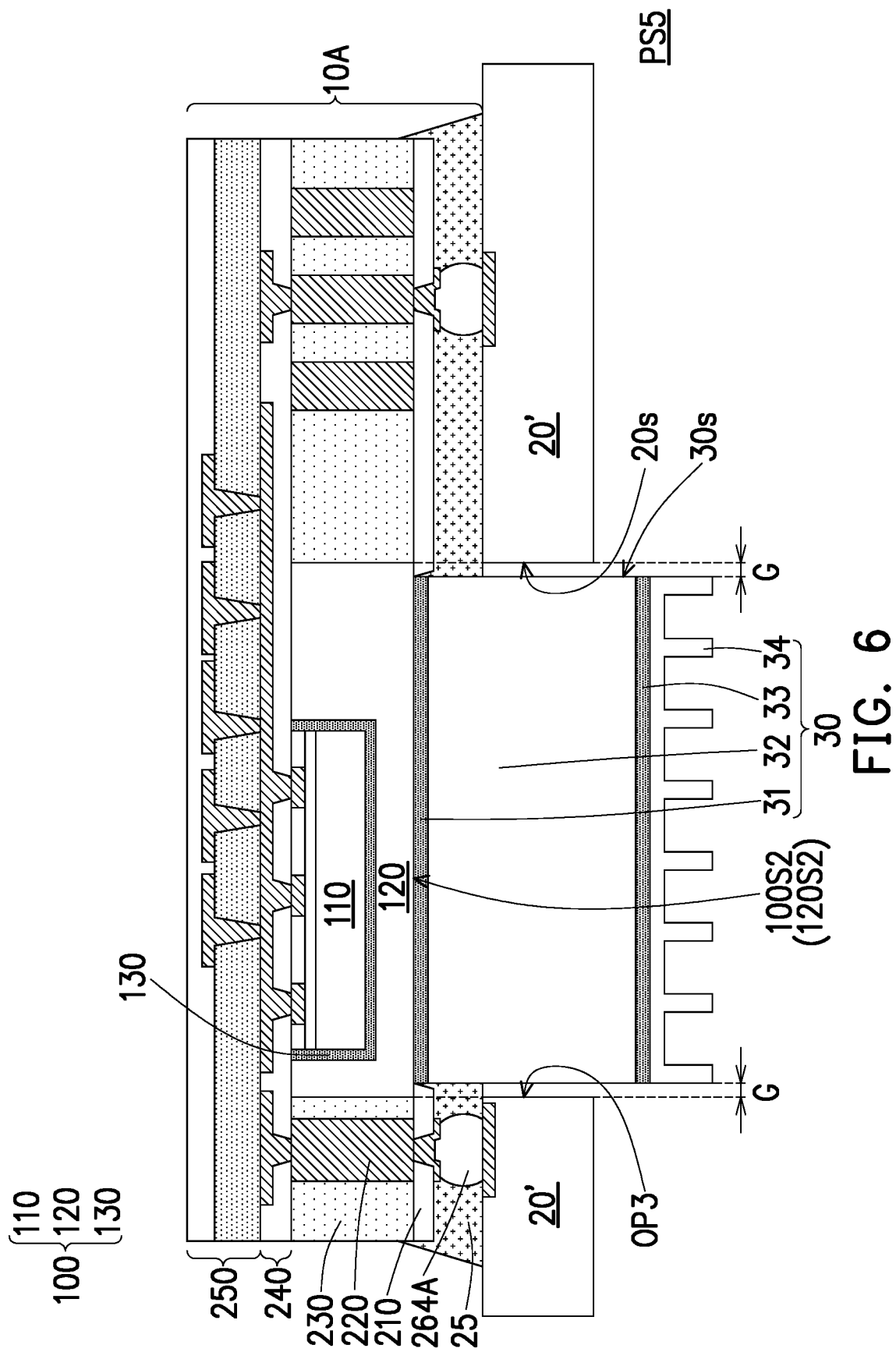

Referring to FIG. 6 and with reference to FIG. 2H, a package structure PS5 is similar to the package structure PS1 shown in FIG. 2H. The package structure PS5 includes a circuit substrate 20', the semiconductor package 10A bonded to the circuit substrate 20', and a heat-dissipating structure 30 thermally coupled to the die structure 100 of the semiconductor package 10A. For example, the circuit substrate 20' is provided with an opening OP3, and the heat-dissipating structure 30 penetrates through the opening OP3 of the circuit substrate 20' to be in direct contact with the second surface 100S2 of the die structure 100. In some embodiments, after the conductive joints 264A are formed, the heat-dissipating structure 30 may be attached to the carrier substrate 120, and then the thermally conductive underfill 25 is formed between the circuit substrate 20' and the semiconductor package 10A to surround the conductive joints 264A and a portion of the heat-dissipating structure 30. Heat generated by the IC die 110 may be conducted to the heat-dissipating structure 30 and then dissipated to outside.

In some embodiments, the heat-dissipating structure 30 includes a first thermally conductive layer 31 and a heat spreader 32. For example, the heat spreader 32 is adhered to the second surface 120S2 of the carrier substrate 120 through the first thermally conductive layer 31, and the first thermally conductive layer 31 and a portion of the heat spreader 32 are laterally covered by the thermally conductive underfill 25. In some embodiments, the heat spreader 32 may be attached to a heat sink 34 through a second thermally conductive layer 33 for more advanced cooling. The first thermally conductive layer 31 and the second thermally conductive layer 33 may be or may include TIM which is an adhesive material having good thermal conductivity. The heat spreader 32 and the heat sink 34 may be utilized to dissipate the heat generated during operation of the semiconductor package 10A. The heat spreader 32 and/or the heat sink 34 may be made of metallic materials such as aluminum, gold, copper, silver, mixtures of metallic components, or other thermally conductive material that may effectively dissipate or disperse the heat away from the semiconductor package 10A.

As shown in FIG. 6, the sidewall 30s of the heat-dissipating structure 30 may be spatially apart from the inner sidewall 20s of the circuit substrate 20' by a gap G, where the lateral dimension of the gap is non-zero. For example, the opening OP3 may be large enough to ensure that when attaching the heat-dissipating structure 30 to the die structure 100, the heat-dissipating structure 30 and the circuit board 20' do not interfere with each other, and the gap G is left between the heat-dissipating structure 30 and the circuit substrate 20'. The gap G may be narrow enough so that the thermally conductive underfill 25 will not flow downwardly along the sidewall 30s of the heat-dissipating structure 30 in the gap G.

Figure 7:
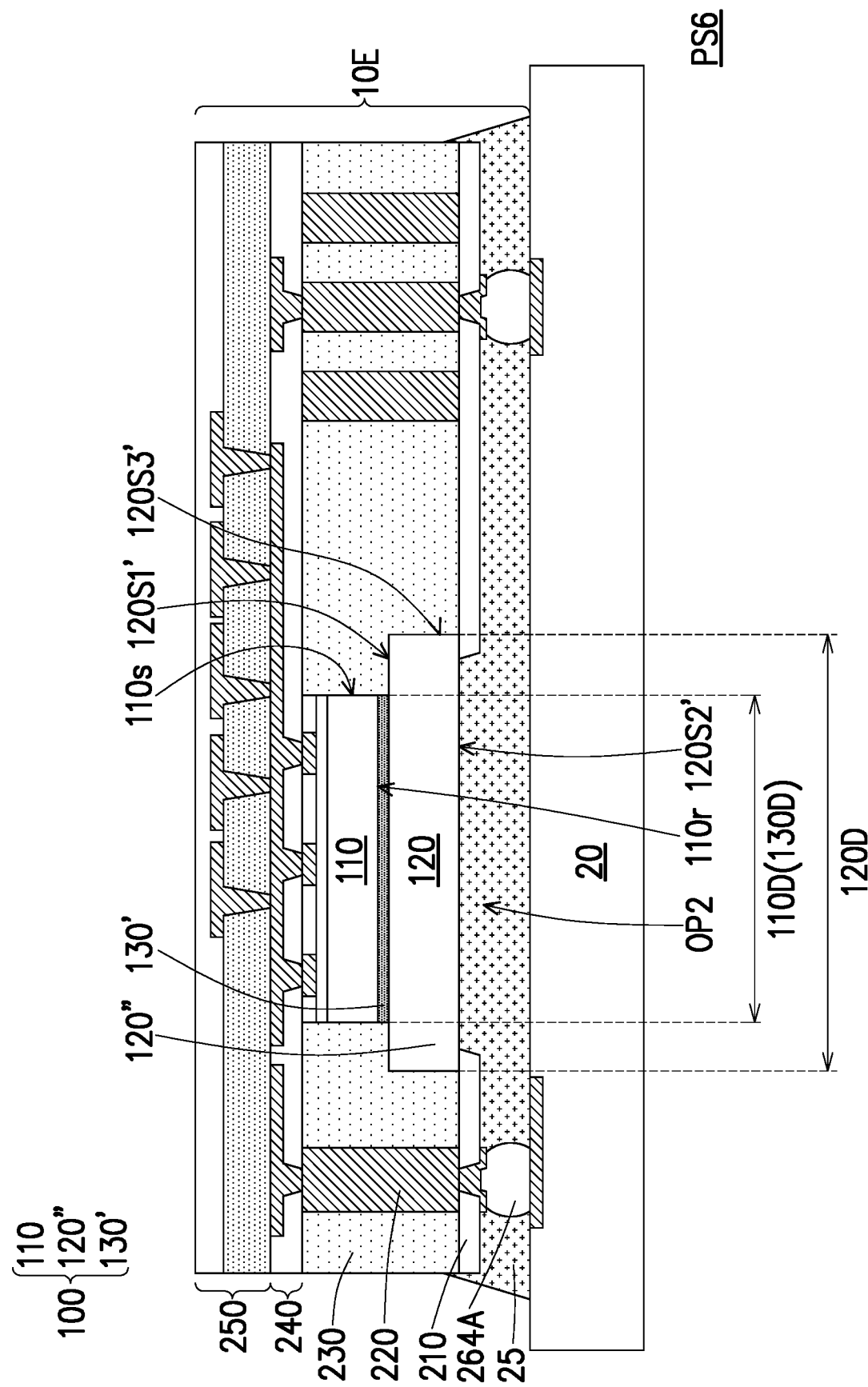

Referring to FIG. 7 and with reference to FIG. 2H, a package structure PS6 including a semiconductor package 10E bonded to the circuit substrate 20 is provided. The difference between the semiconductor package 10E and the semiconductor package 10A shown in FIG. 2G lies in the die structure 100'. For example, the die structure 100' includes a carrier substrate 120", the IC die 110 stacked over the carrier substrate 120", and a thermally conductive layer 130' interposed between the carrier substrate 120" and the IC die 110. The rear surface 110r of the IC die 110 may be attached to the first surface 120S1' of the carrier substrate 120" through the thermally conductive layer 130', and the thermally conductive underfill 25 passing through the patterned dielectric layer 210 may be in direct contact with the second surface 120S2' of the carrier substrate 120". In some embodiments, the surface area of the first surface 120S1' of the carrier substrate 120" is greater than that of the rear surface 110r of the IC die 110. For example, a lateral dimension 120D of the carrier substrate 120" is substantially greater than a lateral dimension 110D of the IC die 110 (or a lateral dimension 130D of the thermally conductive layer 130'). The volume of the carrier substrate 120" may be substantially greater than that of the IC die 110.

In some embodiments, the rear surface 110r of the IC die 110 may be entirely located within a boundary of the first surface 120S1' of the carrier substrate 120". In some embodiments, the thermally conductive layer 130' underlies the rear surface 110r of the IC die 110, and the sidewall 110s of the IC die 110 and the sidewall of the thermally conductive layer 130' are covered by the insulating encapsulation 230. The sidewall 120S3' of the carrier substrate 120" may also be covered by the insulating encapsulation 230. In some embodiments, a portion of the insulating encapsulation 230 extends along the sidewall 110s of the IC die 110 and overlies the first surface 120S1' of the carrier substrate 120". For example, heat generated in the IC die 110 is diffused through the thermally conductive layer 130', the carrier substrate 120", and the thermally conductive underfill 25, which is subsequently dissipated in the ambient.

In accordance with some embodiments, a package structure includes a carrier substrate, an IC die thermally coupled to the carrier substrate through a thermally conductive layer, an antenna pattern disposed over the carrier substrate and the IC die, a redistribution structure disposed between the antenna pattern and the IC die, and an underfill disposed below and thermally coupled to the carrier substrate. The antenna pattern is electrically coupled to the IC die.

In accordance with some embodiments, a package structure includes a carrier substrate, an IC die, a thermally conductive layer, a redistribution structure, an antenna pattern, a patterned dielectric layer, and a thermally conductive underfill. The carrier substrate includes a first surface, a second surface opposite to the first surface, and a cavity recessed at the first surface. The IC die is disposed in the cavity of the carrier substrate, and the thermally conductive layer lines the cavity of the carrier substrate and is interposed between the IC die and the carrier substrate. The redistribution structure is disposed on the IC die and the carrier substrate, and the antenna pattern is disposed over the redistribution structure and electrically coupled to the IC die through the redistribution structure. The patterned dielectric layer partially covers the second surface of the carrier substrate, and the thermally conductive underfill passes through the patterned dielectric layer to be in contact with the second surface of the carrier substrate.

In accordance with some embodiments, a manufacturing method of a package structure includes at least the following steps. A carrier substrate is disposed on a dielectric material, where an IC die is disposed in a cavity of the carrier substrate, and a thermally conductive layer is formed in the cavity to separate the IC die from the carrier substrate. An insulating encapsulation is formed on the dielectric material to laterally cover the carrier substrate. A redistribution structure is formed on the insulating encapsulation, the carrier substrate, and the IC die. An antenna pattern is formed over the redistribution structure. A portion of the dielectric material is removed to form an opening of a patterned dielectric layer accessibly exposing at least a portion of the carrier substrate. An underfill is formed in the opening of the patterned dielectric layer to be in thermal contact with the carrier substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a semiconductor substrate;
    an integrated circuit (IC) die thermally coupled to the semiconductor substrate through a thermally conductive layer;
    an antenna pattern disposed over the semiconductor substrate and the IC die;
    a redistribution structure disposed between the antenna pattern and the IC die, and the antenna pattern being electrically coupled to the IC die; and
    an underfill disposed below and thermally coupled to the semiconductor substrate, wherein the underfill extends outward to cover at least a portion of a sidewall of the semiconductor substrate.

2. The package structure of claim 1, wherein a sidewall and a rear surface of the IC die are in physical contact with the thermally conductive layer.

3. The package structure of claim 2, wherein a top surface of the thermally conductive layer is substantially coplanar with an active surface of the IC die that is opposite to the rear surface.

4. The package structure of claim 1, wherein the sidewall of the semiconductor substrate is substantially leveled with an outer sidewall of the redistribution structure.

5. The package structure of claim 4, further comprising:
    a first through substrate via (TSV) penetrating through the semiconductor substrate and electrically connected to the redistribution structure;
    a circuit substrate disposed below the semiconductor substrate with the underfill interposed therebetween; and
    a conductive joint connecting the first TSV and the circuit substrate and laterally covered by the underfill, wherein the circuit substrate is electrically coupled to the IC die through the conductive joint, the first TSV, and the redistribution structure.

6. The package structure of claim 5, further comprising:
    a second TSV penetrating through the semiconductor substrate;
    a first barrier layer and a second barrier layer laterally covering the first TSV and the second TSV, respectively, wherein the second TSV is electrically coupled to electrical ground.

7. The package structure of claim 1, further comprising:
    a patterned dielectric layer partially covering the semiconductor substrate, wherein the underfill extends into the patterned dielectric layer to be in physical contact with the semiconductor substrate.

8. The package structure of claim 7, wherein the semiconductor substrate comprises a bottom surface connected to the sidewall of the semiconductor substrate, the bottom surface of the semiconductor substrate comprises a first region covered by the underfill and a second region covered by the patterned dielectric layer, and the first region is greater than the second region.

9. The package structure of claim 7, wherein the sidewall of the semiconductor substrate is substantially leveled with an outer sidewall of the patterned dielectric layer.

10. The package structure of claim 1, wherein the antenna pattern comprises a conductive via which is tapered toward the redistribution structure.

11. The package structure of claim 1, wherein the redistribution structure comprises a conductive via which is tapered toward the IC die.

12. A package structure, comprising:
a carrier substrate comprising a first surface, a second surface opposite to the first surface, a sidewall connected to the first surface and the second surface, and a cavity recessed at the first surface;
an integrated circuit (IC) die disposed in the cavity of the carrier substrate;
a thermally conductive layer lining the cavity of the carrier substrate and interposed between the IC die and the carrier substrate;
a redistribution structure disposed on the IC die and the carrier substrate;
an antenna pattern disposed over the redistribution structure and electrically coupled to the IC die through the redistribution structure;
a patterned dielectric layer partially covering the second surface of the carrier substrate; and
a thermally conductive underfill passing through the patterned dielectric layer to be in contact with the second surface of the carrier substrate, the thermally conductive underfill extending outward to cover at least a portion of the sidewall of the carrier substrate.

13. The package structure of claim 12, further comprising:
a circuit substrate disposed below the carrier substrate, and the thermally conductive underfill being interposed between the circuit substrate and the carrier substrate; and
a conductive joint disposed on the circuit substrate and electrically coupled to the IC die, and the conductive joint being surrounded by the thermally conductive underfill.

14. The package structure of claim 12, further comprising:
a plurality of through substrate vias (TSVs) penetrating through the carrier substrate, and at least a portion of the TSVs being electrically coupled to the IC die through the redistribution structure; and
a barrier layer isolating the carrier substrate from the TSVs.

15. The package structure of claim 12, wherein the first surface of the carrier substrate is substantially leveled with a major surface of the IC die that is connected to the redistribution structure.

16. The package structure of claim 12, wherein the second surface of the carrier substrate comprises a first region covered by the thermally conductive underfill, and a second region covered by the patterned dielectric layer and substantially less than the first region.

17. A package structure, comprising:
a carrier substrate comprising an upper surface, a lower surface opposite to the upper surface, and a cavity recessed at the upper surface;
an integrated circuit (IC) die disposed in the cavity of the carrier substrate;
a thermally conductive layer disposed in the cavity of the carrier substrate to thermally couple the IC die to the carrier substrate;
a redistribution structure disposed on the IC die and the upper surface of the carrier substrate;
an antenna pattern disposed over the redistribution structure and electrically coupled to the IC die through the redistribution structure;
a patterned dielectric layer disposed on the lower surface of the carrier substrate; and
a thermally conductive underfill disposed on the lower surface of the carrier substrate, the thermally conductive underfill extending outward to cover sidewalls of the patterned dielectric layer and the carrier substrate.

18. The package structure of claim 17, further comprising:
a plurality of through substrate vias (TSVs) penetrating through the carrier substrate, and at least a portion of the TSVs being electrically coupled to the IC die through the redistribution structure.

19. The package structure of claim 17, wherein the upper surface of the carrier substrate is substantially leveled with a major surface of the IC die that is connected to the redistribution structure.

20. The package structure of claim 17, wherein the lower surface of the carrier substrate comprises a first region covered by the thermally conductive underfill, and a second region covered by the patterned dielectric layer and substantially less than the first region.

* * * * *